US010912232B2

(12) United States Patent
Nakajima et al.

(10) Patent No.: US 10,912,232 B2
(45) Date of Patent: Feb. 2, 2021

(54) ELECTRONIC CIRCUIT BOARD AND POWER CONVERSION DEVICE

(71) Applicant: Mitsubishi Electric Corporation, Tokyo (JP)

(72) Inventors: Koji Nakajima, Tokyo (JP); Yuji Shirakata, Tokyo (JP); Kenta Fujii, Tokyo (JP); Shota Sato, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/462,294

(22) PCT Filed: Nov. 29, 2017

(86) PCT No.: PCT/JP2017/042886
§ 371 (c)(1),
(2) Date: May 20, 2019

(87) PCT Pub. No.: WO2018/105464
PCT Pub. Date: Jun. 14, 2018

(65) Prior Publication Data
US 2019/0320554 A1 Oct. 17, 2019

(30) Foreign Application Priority Data
Dec. 9, 2016 (JP) ................................. 2016-239137

(51) Int. Cl.
H05K 1/02 (2006.01)
H05K 1/16 (2006.01)
(Continued)

(52) U.S. Cl.
CPC ........... H05K 7/2089 (2013.01); H01F 30/06 (2013.01); H02M 7/003 (2013.01);
(Continued)

(58) Field of Classification Search
CPC ...... H02M 7/003; H02M 3/28; H05K 7/2089; H05K 1/0204; H05K 7/20; H05K 1/16;
(Continued)

(56) References Cited

U.S. PATENT DOCUMENTS 5,929,733 A * 7/1999 Anzawa .............. H01F 17/0013
336/200
6,459,586 B1 * 10/2002 Miller ................... H01F 17/043
174/252
(Continued)

FOREIGN PATENT DOCUMENTS

JP 2005191378 A 7/2005
JP 2010109309 A 5/2010
(Continued)

OTHER PUBLICATIONS

International Search Report (with English translation) and Written Opinion issued in corresponding International Patent Application No. PCT/JP2017/042886, 9 pages (Mar. 6, 2019).
(Continued)

Primary Examiner — Anatoly Vortman
(74) Attorney, Agent, or Firm — Buchanan Ingersoll & Rooney PC

(57) ABSTRACT

In an electronic circuit board of a power conversion device or the like, heat interference between parts mounted on a multi-layer printed circuit board is suppressed in order to place the mounted parts close to each other. The mounted parts include a semiconductor element and a magnetic part formed by a coil pattern, which is made from a copper foil of the printed circuit board, and by a magnetic core. A screw fixing portions is placed in the surroundings of the semiconductor element and the coil pattern. A heat radiation pattern connected to the screw fixing portion is provided between and around the semiconductor element and the coil pattern when viewed from a direction perpendicular to a principal surface of the multi-layer printed circuit board. The screw fixing portion is connected to a cooler in a manner that gives the screw fixing portion heat conductance and electrical conductance.

15 Claims, 13 Drawing Sheets

(51) Int. Cl.
*H02M 7/00* (2006.01)
*H01F 30/06* (2006.01)
*H05K 7/20* (2006.01)
*H05K 1/18* (2006.01)

(52) U.S. Cl.
CPC .......... *H05K 1/0204* (2013.01); *H05K 1/165* (2013.01); *H05K 1/181* (2013.01); *H05K 2201/10409* (2013.01)

(58) Field of Classification Search
CPC .......... H05K 1/165; H05K 1/181; H05K 1/02; H05K 3/46; H05K 2201/10409; H01F 30/10; H01F 30/06
USPC .......................................... 361/709; 174/252
See application file for complete search history.

(56) References Cited

U.S. PATENT DOCUMENTS

| | | | | |
|---|---|---|---|---|
| 8,130,499 | B2* | 3/2012 | Ohnishi | H01L 23/053 174/16.3 |
| 8,334,747 | B2* | 12/2012 | Matsumoto | H01F 27/22 336/200 |
| 9,480,159 | B2* | 10/2016 | Hachiya | H05K 1/165 |
| 9,788,410 | B2* | 10/2017 | Uchiyama | H05K 3/28 |
| 2003/0174037 | A1* | 9/2003 | Hooey | H01F 27/266 336/61 |
| 2012/0112866 | A1 | 5/2012 | Matsumoto | |
| 2012/0161911 | A1* | 6/2012 | Moiseev | H01F 27/02 336/55 |
| 2016/0035481 | A1* | 2/2016 | Hachiya | H01F 27/2804 336/61 |
| 2018/0350514 | A1* | 12/2018 | Nakajima | H01F 30/10 |

FOREIGN PATENT DOCUMENTS

| | | |
|---|---|---|
| JP | 2015223044 A | 12/2015 |
| WO | 2011010491 A1 | 1/2011 |
| WO | 2016098538 A1 | 6/2016 |

OTHER PUBLICATIONS

Shirakata, Y., et al, "Low Cost Electronics Packaging Technology for Power Electronics Equipment Utilizing Printed Circuit Board," Technical Journal, Mitsubishi Electric, (English translation of P35), p. 35-p. 38 (Jul. 2017).

* cited by examiner 2, 42

FIRST OUTER LAYER

FIRST INNER LAYER

SECOND INNER LAYER

SECOND OUTER LAYER

SECTION A1

SECTION A2

SECTION A3

FIRST OUTER LAYER

FIRST INNER LAYER

SECOND INNER LAYER

SECOND OUTER LAYER

FIRST OUTER LAYER

FIRST INNER LAYER

SECOND INNER LAYER

SECOND OUTER LAYER

ELECTRONIC CIRCUIT BOARD AND POWER CONVERSION DEVICE

TECHNICAL FIELD

The present invention relates to an electronic circuit board and power conversion device including a magnetic part that is constructed with the use of a patterned coil of a printed circuit board.

BACKGROUND ART

A power conversion device, for example, is constructed from an electronic circuit board and, in some power conversion devices, a surface mounting semiconductor element is mounted on a printed circuit board on which a patterned coil is formed, and a lower surface of the printed circuit board is in contact with a cooler in order to dissipate heat. In addition to the level of cooling performance at which the lower surface of the printed circuit board is cooled, heat interference of the patterned coil and the semiconductor element is an important factor in temperature reduction of the patterned coil and the semiconductor element. As in Patent Literature 1, the heat interference is suppressed by, for example, forming a through-hole in wiring that electrically connects the semiconductor element and the patterned coil, and bringing the through-hole into contact with a cooler for heat radiation.

CITATION LIST

Patent Literature

[PTL 1] JP 2010-109309 A

Technical Problem

When the area of the printed circuit board is to be reduced, the semiconductor element and the patterned coil, namely, a coil pattern, are positioned closer to each other, which causes heat interference of the semiconductor element and the coil pattern also in portions other than the wiring connecting the semiconductor element and the coil pattern. Heat interference occurs between the semiconductor element and another semiconductor element as well when there are a plurality of semiconductor elements.

It is an object of the present invention to provide an electronic circuit board and a power conversion device, in each of which heat interference is suppressed between mounted parts, for example, a semiconductor element and a magnetic part that is formed by a coiled pattern and by a magnetic core.

Solution to Problem

According to one embodiment of the present invention, there are provided an electronic circuit board and the like including: a multi-layer printed circuit board having mounted thereon a magnetic part and semiconductor elements, the magnetic part being formed by a magnetic core and a coil pattern formed by a circuit pattern, and the semiconductor elements being connected to the circuit pattern; a cooler placed on an opposite side from a mounting surface of the multi-layer printed circuit board; an insulating member, which has heat conductance, and is placed between the multi-layer printed circuit board and the cooler; a screw fixing portion placed in surroundings of the coil pattern and the semiconductor elements to fix the multi-layer printed circuit board and the cooler together; and a heat radiation pattern placed between at least two out of the coil pattern and the semiconductor elements when viewed from a direction perpendicular to a principal surface of the multi-layer printed circuit board, wherein the heat radiation pattern, the screw fixing portion, and the cooler are directly connected in a manner that gives heat conductance and electrical conductance to the heat radiation pattern, the screw fixing portion, and the cooler.

Advantageous Effects of Invention

According to one embodiment of the present invention, it is possible to provide the electronic circuit board and the power conversion device, in each of which heat interference is suppressed between the mounted parts, for example, the semiconductor element and the magnetic part formed by the coiled pattern and the magnetic core.

DESCRIPTION OF EMBODIMENTS

In the present invention, heat radiation patterns to be connected to screw fixing portions, which are placed around semiconductor elements and a coil pattern, are provided between and around the semiconductor elements and the coil pattern when viewed from a direction perpendicular to the printed circuit board, and the screw fixing portions are connected directly to a cooler in a manner that gives heat conductance and electrical conductance to the screw fixing portions.

Heat transmitted in a planar direction between the plurality of semiconductor elements and the coil pattern is released to the cooler through the heat radiation patterns, and heat interference between mounted parts of the electronic circuit board is consequently suppressed. This allows the mounted parts to be placed close to one another, and helps to reduce the area of the printed circuit board.

The electronic circuit board according to the present invention is described below through embodiments with reference to the drawings, taking as an example a power conversion device in which a transformer is constructed from the coil pattern. In the embodiments, the same or equivalent portions are denoted by the same reference symbols, and a duplicate description is omitted.

First Embodiment

Figure 1:
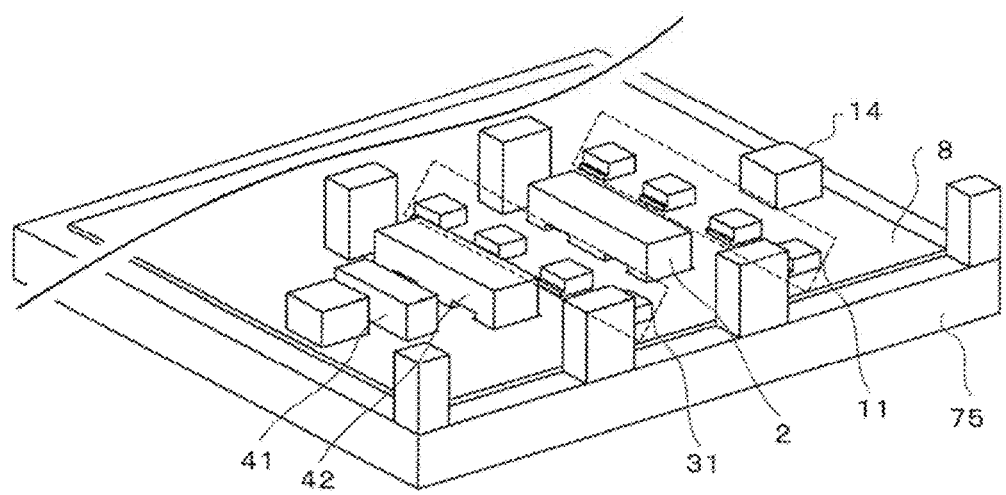
FIG. 1 is a perspective view of an example of the schematic configuration of a power conversion device according to embodiments of the present invention.

FIG. 1 is a perspective view of an example of the schematic configuration of a power conversion device according to the embodiments of the present invention. The power conversion device includes switching elements 11 and rectifier elements 31, which are surface mounting semiconductor elements mounted on a front surface of a printed circuit board 8 having a multi-layer structure as described later with reference to FIGS. 5A to 5D and FIGS. 6A to 6D. The power conversion device also includes a patterned coil 81, a transformer 2, and a smoothing choke coil 42. The patterned coil 81 is formed by a coil pattern, which is a circuit pattern on the printed circuit board 8 and which is formed by, for example, a copper foil pattern as described later with reference to FIG. 3. The transformer 2 and the smoothing choke coil 42 are magnetic parts including magnetic cores (23 and 24), which form a magnetic path of the patterned coil, and formed from the front surface to a rear surface piercing the printed circuit board 8. The power conversion device further includes an input capacitor 14 and an output capacitor 41, which are formed on the front surface of the printed circuit board 8, and a control circuit 5, which is described later with reference to FIG. 4. A cooler 75, which is high in heat conductance and which absorbs heat generated by the components of the power conversion device, namely, the semiconductor elements (11 and 31) and the magnetic parts (2 and 42), is placed on the rear surface of the printed circuit board 8. The cooler 75 is cooled with air or water to cool the components of the power conversion device. The cooler 75 may be unitary with an exterior case (not shown) of the power conversion device.

Figure 2:
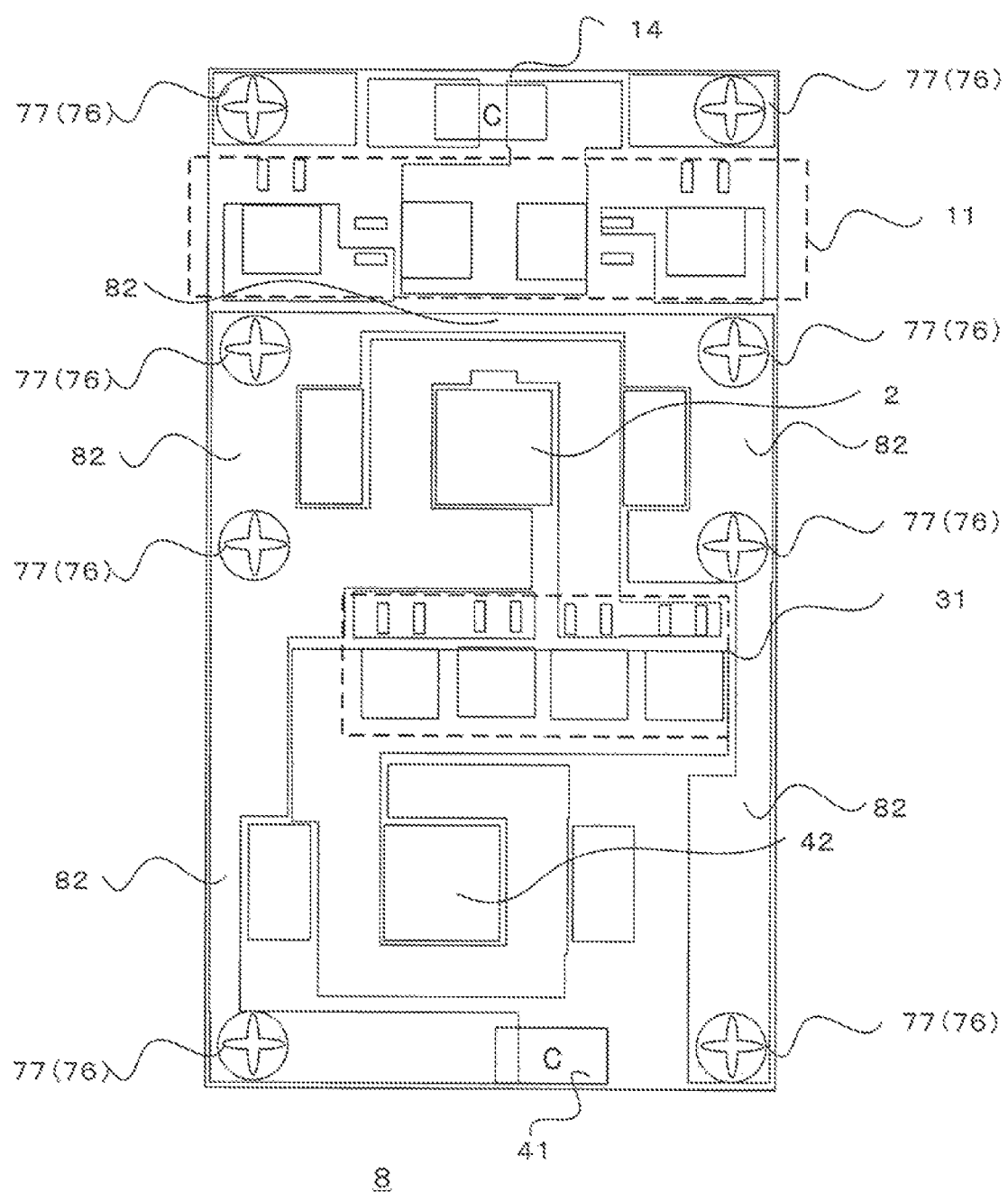
FIG. 2 is a perspective top view of an example of a multi-layer printed circuit board in the power conversion device according to the embodiments of the present invention.

FIG. 2 is a perspective top view of an example of the printed circuit board in the power conversion device according to the present invention. As illustrated in FIG. 2, screw fixing portions 76 are placed around the semiconductor elements (11 and 31), around the coil pattern corresponding to portions of the magnetic parts (2 and 42), and in edge portions of the printed circuit board 8. The printed circuit board 8 is fixed to the cooler 75 at the screw fixing portions 76 with screws 77. Heat radiation patterns 82 are connected to the screw fixing portions 76. In FIG. 1 and FIG. 2 and the embodiments described later, elements mounted to the printed circuit board 8 and the layout of the heat radiation pattern slightly vary, but the basic structure is the same.

An insulating sheet 78, which is an insulating member high in heat conductance and heat radiation effect and electrically insulated, is interposed between the printed circuit board 8 and the cooler 75 as described later with reference to FIGS. 6A to 6D and FIGS. 14A and 14B, in a place between the printed circuit board 8 and the cooler 75 that requires electric insulation.

The principal surfaces of the printed circuit board 8 are given as, for example, a front surface and a rear surface to discriminate the "front surface" and "rear surface" of the printed circuit board 8 from each other. The surface on which the semiconductor elements and others are mounted is the "front surface".

Figure 3:
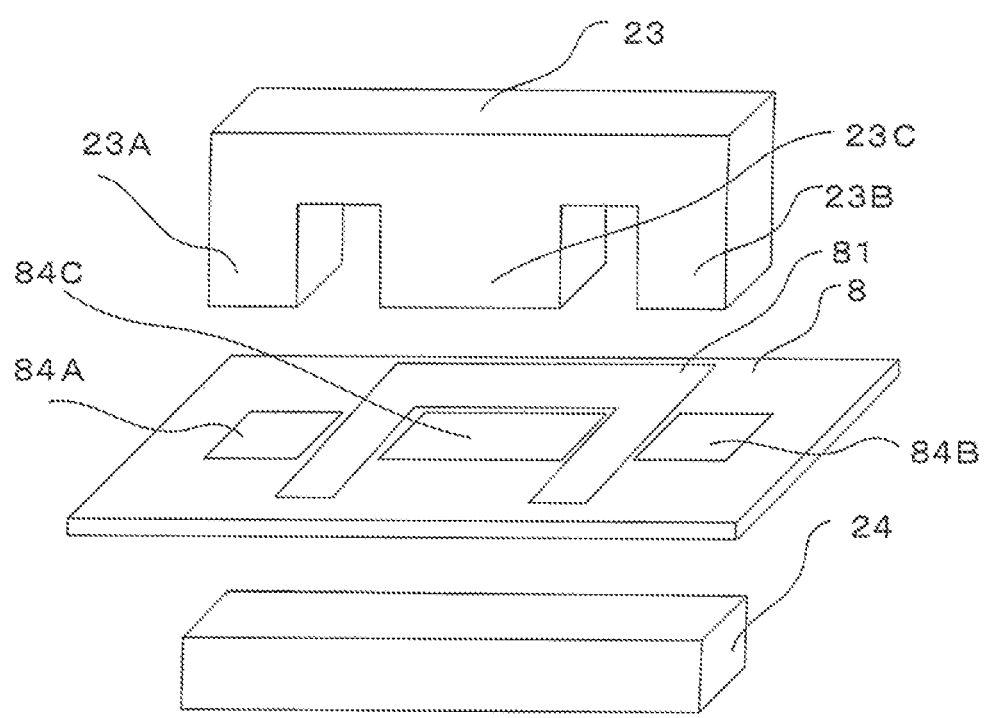
FIG. 3 is an exploded perspective view of portions of magnetic parts that are components of the power conversion device according to the embodiments of the present invention.

FIG. 3 is an exploded perspective view of portions of the magnetic parts (2 and 42) that are components of the power conversion device according to the embodiments of the present invention. The patterned coil 81 is placed around through-holes 84A, 84B, and 84C opened in the printed circuit board 8. A middle leg portion 23C and outer leg portions 23A and 23B of the E-shaped core 23 are inserted from one surface of the printed circuit board 8 into the through-holes 84C, 84A, and 84B, respectively, so that end surfaces of the leg portions are joined to the I-shaped core 24, which is on the other surface of the printed circuit board 8, and so that a magnetic path is formed for a magnetic field generated by the patterned coil 81. While the cores in the first embodiment have an E shape and an I shape, the cores may be, for example, a combination of an E-shaped core and another E-shaped core, EER-shaped cores in which a section orthogonal to the magnetic path direction of a middle leg portion is circular, a combination of a U-shaped core and an I-shaped core, or a combination of a U-shaped core and another U-shaped core.

Figure 4:
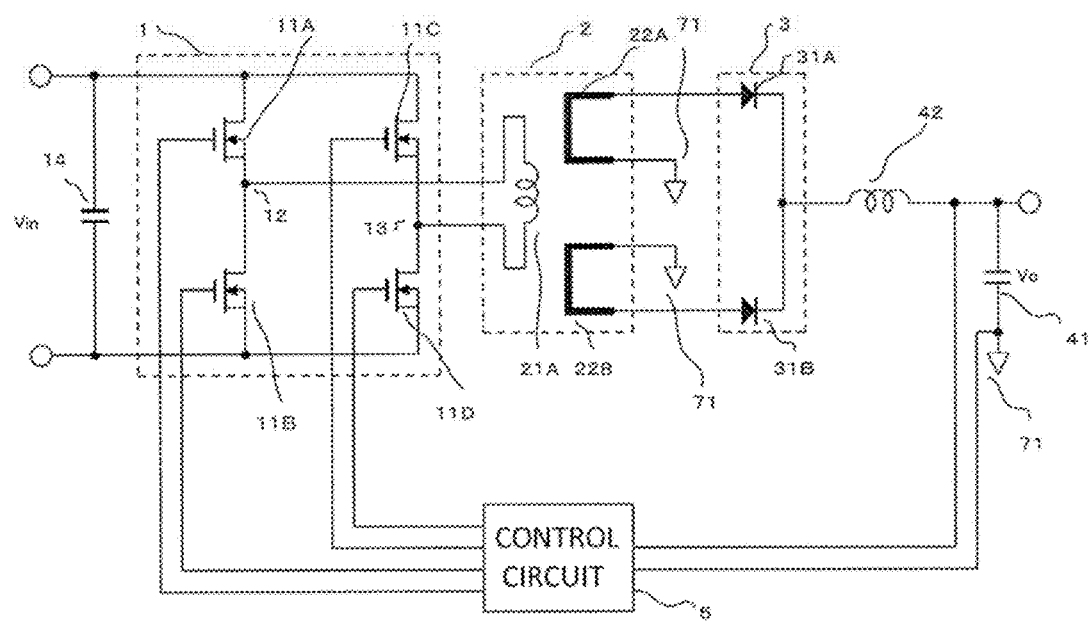
FIG. 4 is a circuit diagram of an example of a power conversion device according to a first embodiment of the present invention.

FIG. 4 is a circuit diagram of an example of a power conversion device according to the first embodiment of the present invention. A primary-side drive circuit 1 includes switching elements 11A and 11B connected in series, and switching elements 11C and 11D connected in series. The switching elements are, for example, N-ch MOSFETs. A positive side of the input capacitor 14, to which an input voltage Vin is supplied, is connected to drain terminals of the switching elements 11A and 11C. A negative side of the input capacitor 14 is connected to source terminals of the switching elements 11B and 11D. A primary-side winding wire 21A of the transformer 2 is connected between a connection point 12, which connects the source side of the switching element 11A and the drain side of the switching element 11B, and a connection point 13, which connects the source side of the switching element 11C and the drain side of the switching element 11D. A rectifier circuit 3 includes rectifier elements 31A and 31B. The rectifier elements 31A and 31B are connected, on the anode side, one end of a secondary-side winding wire 22A and one end of a secondary-side winding wire 22B, respectively, in the transformer 2, and are both connected, on the cathode side, to one end of the smoothing choke coil 42. The other end of the smoothing choke coil 42 is connected to one end of the output capacitor 41 that is an output of the power conversion device. The other end of the output capacitor 41, the other end of the secondary-side wiring wire 22A of the transformer 2, and the other end of the secondary-side winding wire 22B of the transformer 2 are each connected to a reference electric potential 71 on the output side of the power conversion device.

In the first embodiment, the primary-side wiring wire 21A of the transformer 2 is wound in four turns, and the secondary-side winding wires 22A and 22B of the transformer 2 are each wound in one turn. A positive voltage and a negative voltage that are each ¼ of the input voltage Vin are accordingly generated in the secondary-side winding wires 22A and 22B in a period in which the switching elements 11A and 11D are switched on and a period in which the switching elements 11B and 11C are turned on. The positive voltage and the negative voltage are rectified by the rectifier elements 31A and 31B, and the smoothing choke coil 42 and the output capacitor 41 turn the rectified voltages into a direct-current voltage through smoothing. An output voltage Vo of the power conversion device is determined by the ratio of the number of turns of the primary-side winding wire 21A and the number of turns of the secondary-side winding wires 22A and 22B in the transformer 2, and the on/off periods of the switching elements 11A to 11D.

The control circuit 5 feeds the output voltage Vo between the ends of the output capacitor 41 back to input the output voltage Vo, and is connected to gate terminals of the switching elements 11A to 11D. The control circuit 5 controls the on/off periods of the switching elements 11A to 11D so that the output voltage Vo reaches a set value determined in advance. While the ratio of the numbers of turns in the transformer 2 is 4:1 in the first embodiment, the ratio of the numbers of turns may be set to 6:1 or 8:1 when the ratio of the input voltage Vin and the output voltage Vo is high, and to 3:1 or 2:1 when the voltage ratio is low.

Figure 5A:
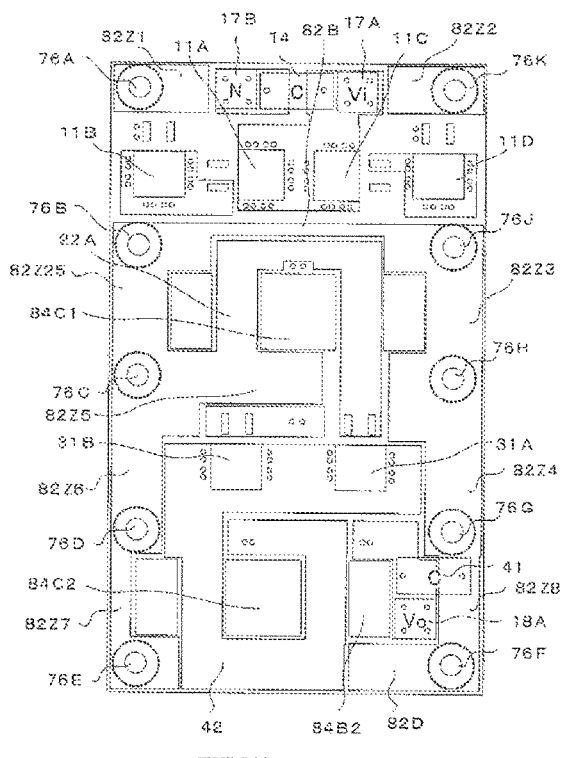
FIGS. 5A to 5D are perspective top views of copper foil patterns on respective layers of a multi-layer printed circuit board of the power conversion device according to the first embodiment of the present invention.
Figure 5B:
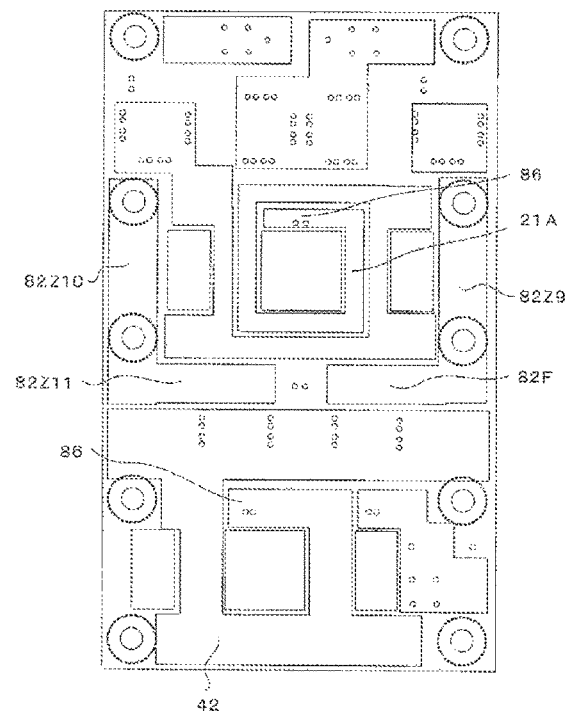
Figure 5C:
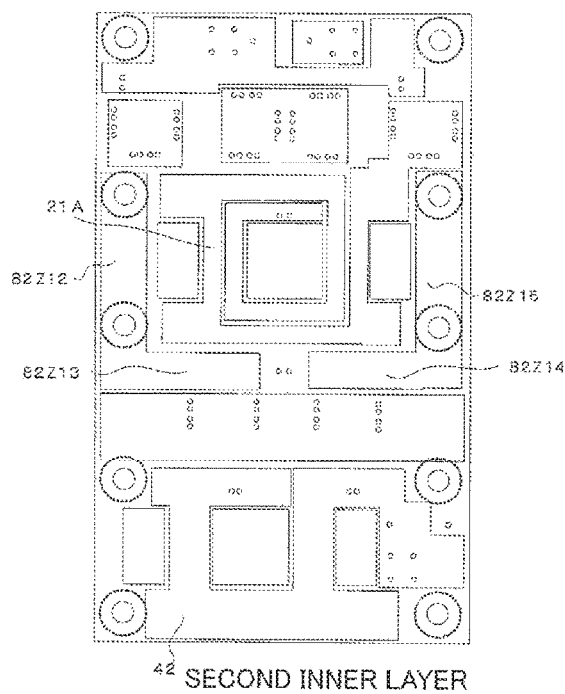
Figure 5D:
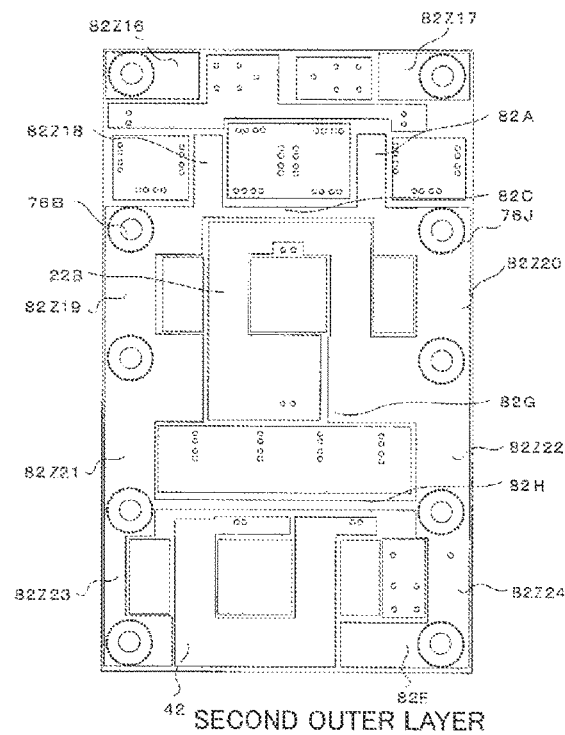
Figure 13:
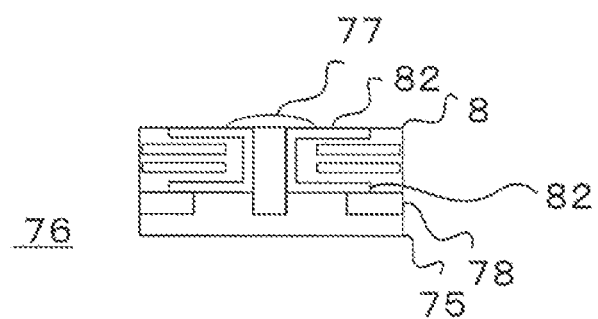
FIG. 13 is a sectional view of a screw fixing portion in the power conversion device according to the present invention.

FIGS. 5A to 5D are perspective top views of copper foil patterns on respective layers of the multi-layer printed circuit board of the power conversion device according to the first embodiment of the present invention. The multi-layer printed circuit board is constructed from a plurality of stacked layers in each of which a heat radiation pattern, a coil pattern, and a circuit pattern are formed on a thin insulating layer as described later with reference to FIGS. 6A to 6D, FIGS. 14A and 14B, and other drawings. FIGS. 5A to 5D, FIGS. 8A to 8D, FIGS. 10A to 10D, and other drawings referred to in a description given later are views seen through the insulating layer, and are each a set of diagrams for illustrating, side by side, the copper foil patterns from which the patterns of the respective layers are formed. FIG. 13 is a sectional view of one screw fixing portion of the power conversion device according to the present invention. The multi-layer printed circuit board 8 has four copper foil layers: a first outer layer, which is illustrated in FIG. 5A and on which surface mounting semiconductor elements and other components are formed, a second outer layer, which is illustrated in FIG. 5D and which is in contact with the cooler 75 directly or via the insulating sheet 78, and a first inner layer and a second inner layer, which are illustrated in FIG. 5B and FIG. 5C, respectively, and which are sandwiched between the outer layers. The layers are electrically connected by copper plating formed on inner walls of through-holes 86 and holes in the screw fixing portion 76A to 76K (the screw fixing portion 76I does not exist and is skipped). In FIG. 13, the layers of the printed circuit board 8 are electrically connected by copper plating, which is the heat radiation pattern 82 formed on the inner wall of the screw hole in each of the screen fixing portions 76A to 76K and, in this state, the screw 77 reaches into the cooler 75 through a screw hole in the printed circuit board 8, without running through the insulating sheet 78, to fix the printed circuit board 8 and the cooler 75 together. When the diameter of the screw fixing portions 76 is too large to plate the inner wall by copper plating, the through-holes 86 are placed in the surroundings of the screw fixing portions 76. The four copper foil layers are insulated by glass epoxy resin or other types of resin.

As illustrated in FIG. 13, the ten screw fixing portions 76A to 76K arranged along the perimeter of the printed circuit board 8 and fixed to the cooler 75 with screws are in contact with the cooler 75 on the second outer layer of FIG. 5D without running through the insulating sheet 78, and thus the screw fixing portions 76A to 76K has the same electric potential as the reference electric potential 71 on the output side of the power conversion device. An input of the power conversion device is connected to an input portion (Vi) 17A and an input portion (N) 17B, which are illustrated in an upper portion of FIG. 5A, and the output of the power conversion device is connected to an output portion (Vo) 18A, which is illustrated in a lower right portion of FIG. 5A, and the cooler 75, which has the reference electric potential 71.

A through-hole 84C1 in the printed circuit board 8 is denoted by a reference symbol 84C1 in FIG. 5A, and the transformer 2 is constructed from the patterned coil 81, which is formed by a coil pattern placed around the through-hole 84C1 as illustrated in FIG. 3. In the transformer 2, the secondary-side winding wire 22A is placed on the first outer layer of FIG. 5A, the secondary-side winding wire 22B is placed on the second outer layer of FIG. 5D, and the primary-side winding wire 21A is placed on the first inner layer of FIG. 5B and the second inner layer of FIG. 5C. The secondary-side winding wires 22A and 22B are each wound in one turn, and are connected at one end to the screw fixing portions 76C and 76H. The primary-side winding wire 21A is wound in two turns on each of the first inner layer and the second inner layer, and is connected by the through-holes 86 denoted by the reference symbol 86 of FIG. 5B, and thus the number of turns of the primary-side winding wire 21A is four turns in total.

Another through-hole 84C2 in the printed circuit board 8 is denoted by a reference symbol 84C2 in a lower portion of FIG. 5A, and the smoothing choke coil 42 is constructed from the patterned coil 81 placed around the through-hole 84C2 as illustrated in FIG. 3. The smoothing choke coil 42 is wound in one turn on each of the layers illustrated in FIG. 5A to FIG. 5D, and a parallel connection between the first outer layer of FIG. 5A and the first inner layer of FIG. 5B and a parallel connection between the second inner layer of FIG. 5C and the second outer layer of FIG. 5D are connected in series by the through-holes 86 denoted by the reference symbol 86 of FIG. 5B, and thus the number of turns of the smoothing choke coil 42 is two turns in total.

As illustrated in an upper portion of FIG. 5A, the switching elements 11A to 11D are arranged between the input portions (Vi) 17A and (N) 17B and the transformer 2 in the order of 11B-11A-11C-11D from the left side of the drawing sheet.

As illustrated in a middle portion of FIG. 5A, the rectifier elements 31B and 31A are arranged between the transformer 2 and the smoothing choke coil 42 in the stated order from the left side of the drawing sheet.

Next, a description is given on the positions of the heat radiation patterns 82, which are high in heat conductance, which are arranged between components, and which are connected to the screw fixing portions 76A to 76K having the same electric potential as that of the cooler 75.

The first outer layer of FIG. 5A includes:
a heat radiation pattern 82Z1 connected to the upper left screw fixing portion 76A and placed between the screw fixing portion 76A and the input portion 17B;
a heat radiation pattern 82Z2 connected to the upper right screw fixing portion 76K and placed between the screw fixing portion 76K and the input portion 17A;
heat radiation patterns 82Z25, 82Z6, and 82Z7, to which the left-side screw fixing portions 76B, 76C, 76D, and 76E are connected;
heat radiation patterns 82Z3, 82Z4, and 82Z8, to which the right-side screw fixing portions 76J, 76H, 76G, and 76F are connected;
a heat radiation pattern 82B, to which the screw fixing portions 76B and 76J are connected, and which is placed between the switching elements 11A and 11C and the secondary-side winding wire 22A;
a heat radiation pattern 82Z5 connected to the screw fixing portion 76C and placed between the secondary-side winding wire 22A and the rectifier element 31B in a manner that makes a part of the heat radiation pattern 82Z5 unitary with the secondary-side winding wire 22A; and
a heat radiation pattern 82D connected to the screw fixing portion 76F and placed between the smoothing choke coil 42, the output portion (Vo) 18A, and the output capacitor (C) 41.

The first inner layer of FIG. 5B includes:
a heat radiation pattern 82Z10, to which the screw fixing portions 76B and 76C of FIG. 5A are connected;
a heat radiation pattern 82Z9, to which the screw fixing portions 76J and 76H are connected;
a heat radiation pattern 82Z11 placed between the primary-side winding wire 21A and the rectifier element 31B; and
a heat radiation pattern 82F placed between the primary-side winding wire 21A and the rectifier element 31A.

The first inner layer of FIG. 5C includes:
a heat radiation pattern 82Z12, to which the screw fixing portions 76B and 76C of FIG. 5A are connected;
a heat radiation pattern 82Z15, to which the screw fixing portions 76J and 76H are connected;
a heat radiation pattern 82Z13 placed between the primary-side winding wire 21A and the rectifier element 31B; and
a heat radiation pattern 82Z14 placed between the primary-side winding wire 21A and the rectifier element 31A.

The second outer layer of FIG. 5D includes:
a heat radiation pattern 82Z16 connected to the screw fixing portion 76A in the upper left portion of FIG. 5A and placed between the screw fixing portion 76A and the input portion 17B;
a heat radiation pattern 82Z17 connected to the screw fixing portion 76K in the upper right portion of FIG. 5A and placed between the screw fixing portion 76K and the input portion 17A;
heat radiation patterns 82Z19, 82Z21, and 82Z23, to which the screw fixing portions 76B, 76C, 76D, and 76E on the left side of FIG. 5A are connected;
heat radiation patterns 82Z20, 82Z22, and 82Z24, to which the screw fixing portions 76J, 76H, 76G, and 76F on the right side of FIG. 5A are connected;
a heat radiation pattern 82C, to which the screw fixing portions 76B and 76J are connected, and which is placed between the switching elements 11A and 11C and the secondary-side winding wire 22B;
a heat radiation pattern 82Z18 connected to the screw fixing portion 76B and placed between the switching elements 11A and 11B;
a heat radiation pattern 82A connected to the screw fixing portion 76J and placed between the switching elements 11C and 11D;
a heat radiation pattern 82G connected to the screw fixing portion 76H and placed between the secondary-side winding wire 22B and the rectifier element 31A in a manner that makes a part of the heat radiation pattern 82G unitary with the secondary-side winding wire 22B;
a heat radiation pattern 82E connected to the screw fixing portion 76F and placed between the smoothing choke coil 42, the output portion 18A, and the output capacitor 41; and
a heat radiation pattern 82H, to which the screw fixing portions 76D and 76G are connected, and which is placed between the rectifier elements 31A and 31B and the smoothing choke coil 42.

In subsequent and other drawings, circuit patterns for electronic circuits electrically connecting parts that are mounted on the printed circuit board 8, for example, switching elements 11 and rectifier elements 31, which are semiconductor elements, the transformer 2 and the smoothing choke coil 42, which are magnetic parts, and the input capacitor 14 and the output capacitor 41, to one another are omitted because the illustration of the circuit patterns makes the drawings complicate and makes it difficult to see the heat radiation patterns.

Figure 6A:
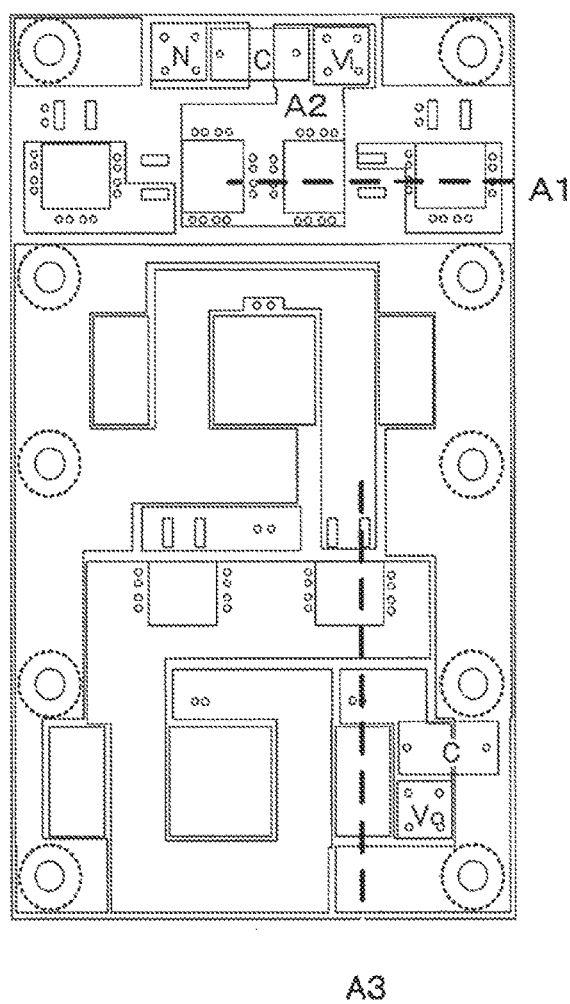
FIGS. 6A to 6D are diagrams for illustrating heat radiation paths of the power conversion device according to the first embodiment of the present invention.
Figure 6B:
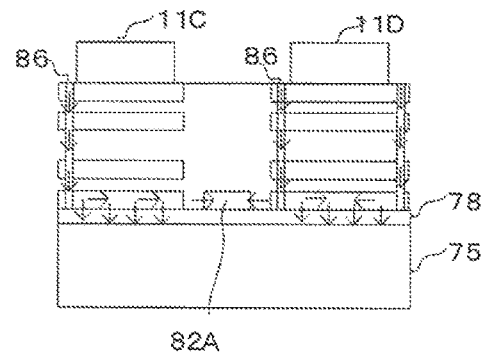
Figure 6C:
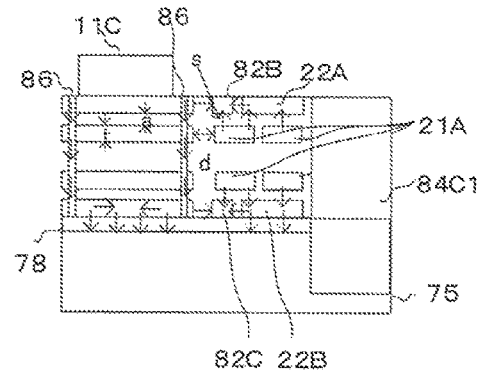
Figure 6D:
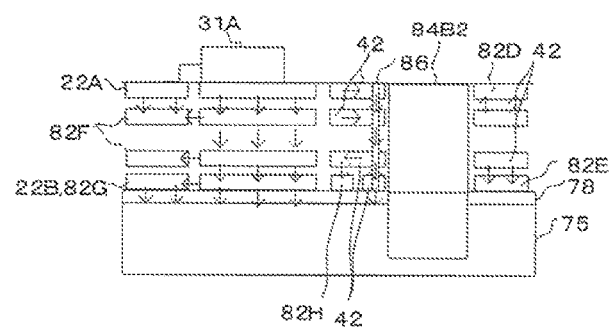

Heat radiation paths of the switching elements 11A to 11D, the rectifier elements 31A and 31B, the primary-side winding wire 21A and secondary-side winding wires 22A and 22B of the transformer 2, and the patterned coil 81 of the smoothing choke coil 42 are described next with reference to FIGS. 5A to 5D, which are perspective top views of the copper foil patterns, and FIGS. 6A to 6D, which include sectional views of the power conversion device according to the first embodiment. FIG. 6A is a perspective top view of the first outer layer illustrated in FIG. 5A. FIG. 6B to FIG. 6D are sectional views taken along the lines A1, A2, and A3, respectively, in FIG. 6A.

As illustrated in FIG. 6B and FIG. 6D, heat generated by the switching elements 11A to 11D and the rectifier elements 31A and 31B is transmitted through the through-holes 86 placed in the surroundings of the elements from the first outer layer at the top of the printed circuit board 8, which is a four-layer substrate, to the second outer layer at the bottom of the four-layer substrate, and is transmitted from the second outer layer to the cooler 75 through the insulating sheet 78.

As illustrated in FIG. 6C, heat generated by the primary-side winding wire 21A of the transformer 2 placed on the first inner layer and second inner layer of the printed circuit board 8 is transmitted through the insulating resin of the printed circuit board 8 to the first outer layer and the second outer layer, and is transmitted, along with heat generated by the secondary-side winding wires 22A and 22B, which are placed on the first outer layer and the second outer layer, respectively, to the cooler 75 from the screw fixing portions 76C and 76H, which are connected to one end of the secondary-side winding wire 22A and one end of the secondary-side winding wire 22B as illustrated in FIG. 5A and FIG. 5D. There is also a path along which heat generated by the primary-side winding wire 21A is transmitted to the through-hole 86 connecting the two turns on the first inner layer and the two turns on the second inner layer, and is transmitted from the second outer layer to the cooler 75 through the insulating sheet 78.

Heat generated by the patterned coils denoted by the reference symbol 42 of FIG. 5A, FIG. 5B, and FIG. 5C as the smoothing choke coil 42 placed on the first outer layer, the first inner layer, and the second inner layer of the printed circuit board 8 is transmitted to the second outer layer through the insulating resin between the layers of the printed circuit board 8, and through the through-holes 86 connecting the patterned coils on the layers, and is transmitted, along with heat generated by the patterned coil that is placed on the second outer layer, from the second outer layer to the cooler 75 through the insulating sheet 78.

Most of the heat generated by the components is transmitted to the cooler 75 through the paths described above. When the components are at a close distance from each other, however, part of heat generated by one component and spread in a planar direction through the insulating resin may be transmitted to another component. The present invention is provided with the heat radiation patterns 82, which are connected to the screw fixing portions 76A to 76K and which have the same electric potential as that of the cooler 75, in order to suppress heat interference between components. Effects of the heat radiation patterns 82 are described next.

Referring to a section A1 of FIG. 6B, as illustrated in FIG. 5D, the heat radiation pattern 82A is placed on the second outer layer between the switching elements 11C and 11D, and heat transmitted in a planar direction between the switching elements 11C and 11D is transmitted to the heat radiation pattern 82A. Although some heat may be transmitted between the switching elements 11C and 11D in a planar direction of the first outer layer, the first inner layer, and the second inner layer, most of the heat is transmitted to the heat radiation pattern 82A because the distance between the switching elements 11C and 11D and the heat radiation pattern 82A in a planar direction on the second outer layer is shorter than the distance between the switching elements 11C and 11D in a planar direction on the first outer layer, the first inner layer, and the second inner layer.

In addition, heat transmitted to the heat radiation pattern 82A is readily transmitted to the cooler 75 because the heat radiation pattern 82A is connected to the screw fixing portion 76J by the copper foil pattern having a heat conductivity of approximately 400 W/mK, whereas the heat conductivity of the insulating resin is approximately 0.3 W/mK, and also because heat is transmitted from the screw fixing portion 76J to the cooler 75 without passing through the insulating sheet 78. Heat interference between the switching elements 11C and 11D can be suppressed in this manner.

Referring to the section A2 of FIG. 6C, heat transmitted in a planar direction between the switching element 11C and the secondary-side winding wire 22A on the first outer layer is transmitted to the heat radiation pattern 82B. Heat transmitted in a planar direction between the switching element 11C and the secondary-side winding wire 22B on the second outer layer is transmitted to the heat radiation pattern 82C.

The thermal resistance on a heat transmission path from the primary-side winding wire 21A on the first inner layer to a pattern below the switching element 11C is considered.

When the heat conductivity of the insulating resin is given as "$\lambda$", the distance between the switching element 11C on the first inner layer and the adjacent primary-side winding wire 21A in a planar direction is given as "d", the thickness of each copper foil pattern is given as "t", a width over which the primary-side winding wire 21A is in contact with the pattern below the switching element 11C is given as "w", and the thermal resistance is represented by "R1", the thermal resistance is expressed as $R1=d/(\lambda \times 2 \times t)$.

The thermal resistance on a heat transmission path from the primary-side winding wire 21A on the first inner layer to the heat radiation pattern 82B on the first outer layer is considered.

When the thickness of the insulating resin between the first outer layer and the first inner layer is given as "a", an area in which the primary-side winding wire 21A on the first inner layer and the heat radiation pattern 82B on the first outer layer overlap is given as "s", and the thermal resistance is represented by "R2", the thermal resistance is expressed as $R2=a/(\lambda \times s)$.

When R1 and R2 are set so that R1>>R2 is satisfied, that is, $d/(w \times t)>>a/s$ is satisfied, heat generated by the primary-side winding wire 21A on the first inner layer is transmitted more to the heat radiation pattern 82B on the first outer layer than in any planar direction. For example, when "d", "w", "t", "a", and "s" are set to 2 mm, 20 mm, 0.1 mm, 0.2 mm, and 50 mm$^2$, respectively, $d/(w \times t)$ is calculated as 1 and a/s is calculated as 0.004.

Similarly, heat generated by the primary-side winding wire 21A on the second inner layer is transmitted more to the heat radiation pattern 82C on the second outer layer than in any planar direction. Heat transmitted to the heat radiation patterns 82B and 82C is transmitted to the cooler 75 from the screw fixing portions 76B and 76J. Heat interference between the switching element 11C and the transformer 2 can be suppressed in this manner.

Referring to the section A3 of FIG. 6D, the heat radiation patterns 82D to 82H are placed between and around the transformer 2, the rectifier element 31A, and the smoothing choke coil 42, and heat interference between the components can be suppressed in the manner described above with reference to the section A1 and the section A2. Heat transmitted from the smoothing choke coil 42 to the output capacitor 41 can also be suppressed by the heat radiation patterns 82D and 82E, and the temperature of the output capacitor 41 can accordingly be lowered.

Figure 14A:
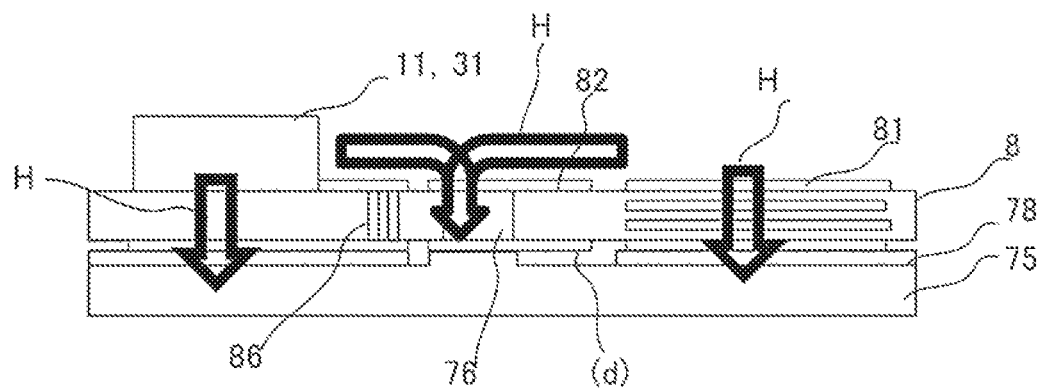
FIGS. 14A and 14B are diagrams for illustrating images of heat radiation paths in the power conversion device according to the present invention.
Figure 14B:
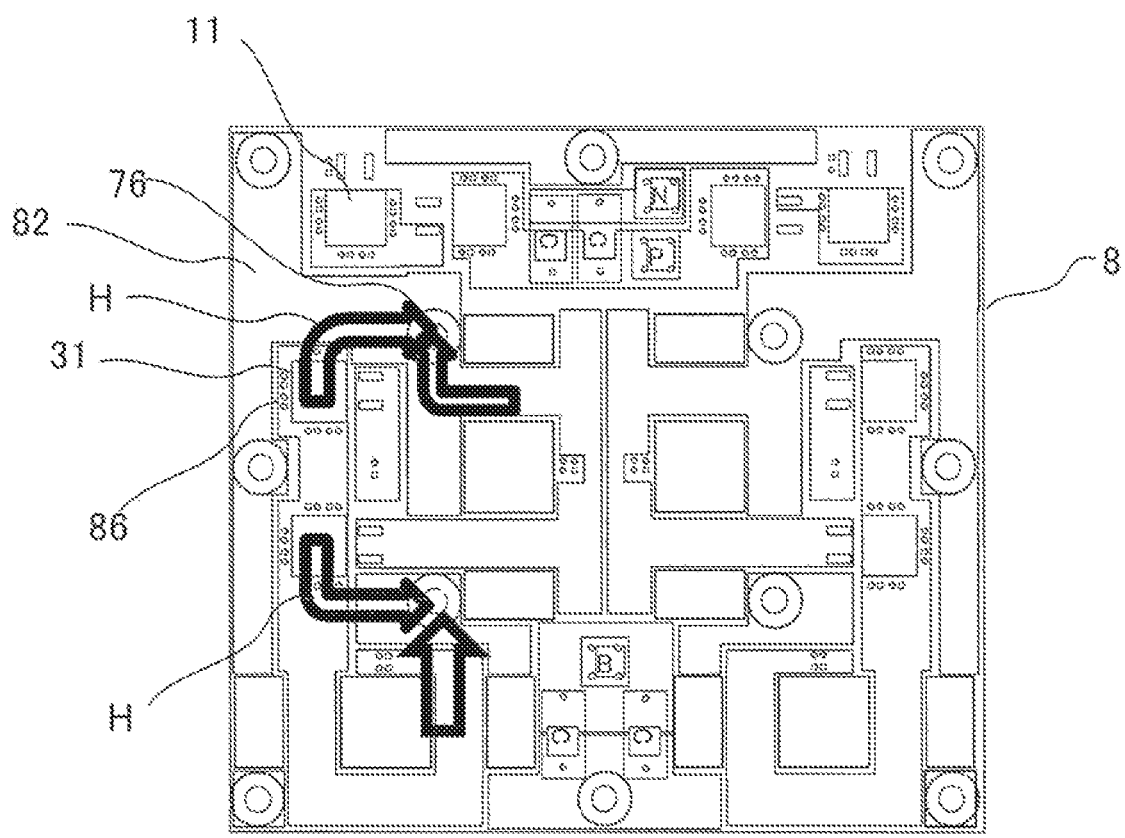

Images of the heat radiation paths described above are described with reference to a sectional view and a top view of FIGS. 14A and 14B. FIGS. 14A and 14B are diagrams for illustrating heat radiation paths in the power conversion device according to the present invention. FIG. 14A is a sectional view, and FIG. 14B is a top view. Arrows H indicate the heat radiation paths. Heat generated by the switching elements 11, the rectifier elements 31, and the patterned coil 81 is transmitted mainly to the second outer layer (d), which is the lowermost layer of the printed circuit board 8, through the through-holes 86 and the insulating layers between the copper foil patterns on the layers of the multi-layer printed circuit board 8, and is then transmitted to the cooler 75 through the insulating sheet 78. Part of the heat generated by the switching elements 11, the rectifier elements 31, and the patterned coil 81 spreads in a planar direction of the printed circuit board 8, but is transmitted to the cooler 75 via the heat radiation patterns 82 having heat conductance and the screw fixing portions 76 having heat conductance. This keeps the heat spread in a planar direction from being transmitted to other parts, thereby suppressing heat interference.

While the description given above uses the sections A1, A2, and A3 of FIGS. 6A to 6D as an example, the heat radiation patterns 82 formed in other portions have the same effects as well, and are capable of suppressing heat interference between components. Heat transmission to the input capacitor 14 and the control circuit 5, which is illustrated only in circuit diagrams, can be suppressed in addition to the heat transmission to the output capacitor 41 described above. Parts low in heat resistance temperature can accordingly be used as the input capacitor 14 and the control circuit 5.

Second Embodiment

A second embodiment of the present invention differs from the first embodiment, which uses a step-down circuit as the step-down transformer 2 of FIG. 4, in that a step-up circuit is provided.

Figure 7:
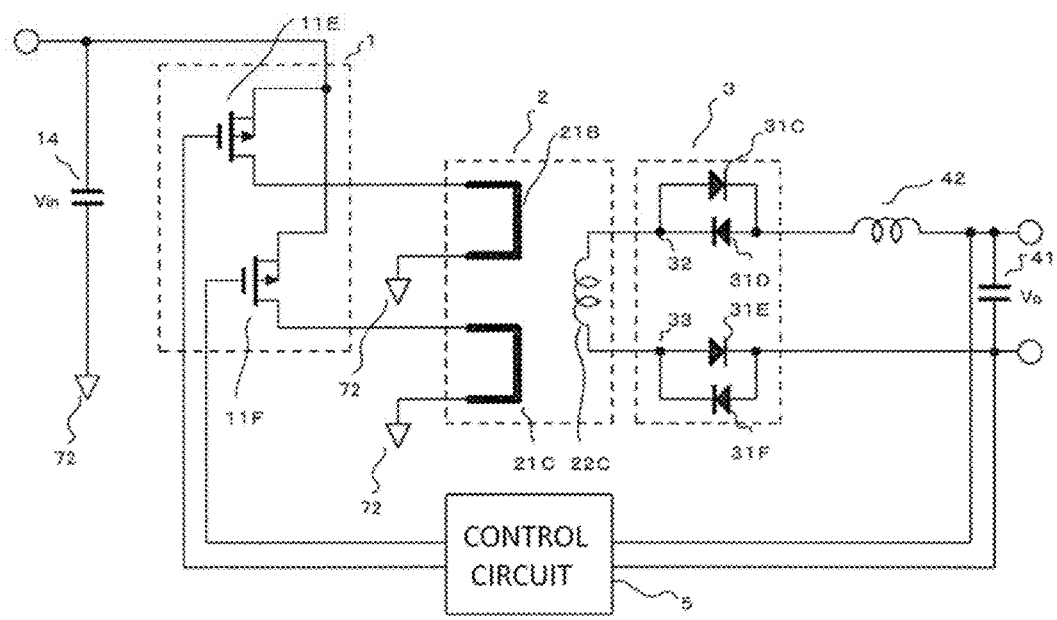
FIG. 7 is a circuit diagram of an example of a power conversion device according to a second embodiment of the present invention.

FIG. 7 is a circuit diagram of an example of a power conversion device according to the second embodiment of the present invention. The step-up transformer 2 of FIG. 7 forms a step-up circuit. The primary-side drive circuit 1 includes switching elements 11E and 11F. The switching elements are, for example, P-ch MOSFETs. Drain terminals of the switching elements 11E and 11F are connected to one end of a primary-side winding wire 21B and one end of a primary-side winding wire 21C in the transformer 2. The positive side of the input capacitor 14, to which the input voltage Vin is supplied, is connected to source terminals of the switching elements 11E and 11F. The other end of the primary-side winding wire 21B and the other end of the primary-side winding wire 21C in the transformer 2, and the negative side of the input capacitor 14, are each connected to a reference electric potential 72 on the input side of the power conversion device. The rectifier circuit 3 includes rectifier elements 31C, 31D, 31E, and 31F. A secondary-side winding wire 22C of the transformer 2 is connected between a connection point 32 connecting an anode of the rectifier element 31C and a cathode of the rectifier element 31D and a connection point 33 connecting an anode of the rectifier element 31E and a cathode of the rectifier element 31F. A connection point between a cathode of the rectifier element 31C and an anode of the rectifier element 31D is connected to one end of the smoothing choke coil 42, and the other end of the smoothing choke coil 42 is connected to the positive side of the output capacitor 41, which is an output of the power conversion device. A connection point between a cathode of the rectifier element 31E and an anode of the rectifier element 31F is connected to the negative side of the output capacitor 41.

In the second embodiment, the primary-side wiring wires 21B and 21C of the transformer 2 are each wound in one turn, and the secondary-side winding wire 22C of the transformer 2 is wound in four turns. A positive voltage and a negative voltage that are each four times the input voltage Vin are accordingly generated in the secondary-side winding wire 22C in a period in which the switching element 11E is switched on and a period in which the switching element 11F is turned on. The positive voltage and the negative voltage are rectified by the rectifier elements 31C and 31F, and the smoothing choke coil 42 and the output capacitor 41 turn the rectified voltages into a direct-current voltage through smoothing. An output voltage Vo of the power conversion device is determined by the ratio of the number of turns of the primary-side winding wires 21B and 21C and the number of turns of the secondary-side winding wire 22C in the transformer 2, and the on/off periods of the switching elements 11E and 11F.

The control circuit 5 feeds the output voltage Vo between the ends of the output capacitor 41 back to input the output voltage Vo, and is connected to gate terminals of the switching elements 11E and 11F. The control circuit 5 controls the on/off periods of the switching elements 11E and 11F so that the output voltage Vo reaches a set value determined in advance. While the ratio of the numbers of turns in the transformer 2 is 1:4 in the second embodiment, the ratio of the numbers of turns may be set to 1:6 or 1:8 when the ratio of the input voltage Vin and the output voltage Vo is high, and to 1:3 or 1:2 when the voltage ratio is low.

Figure 8A:
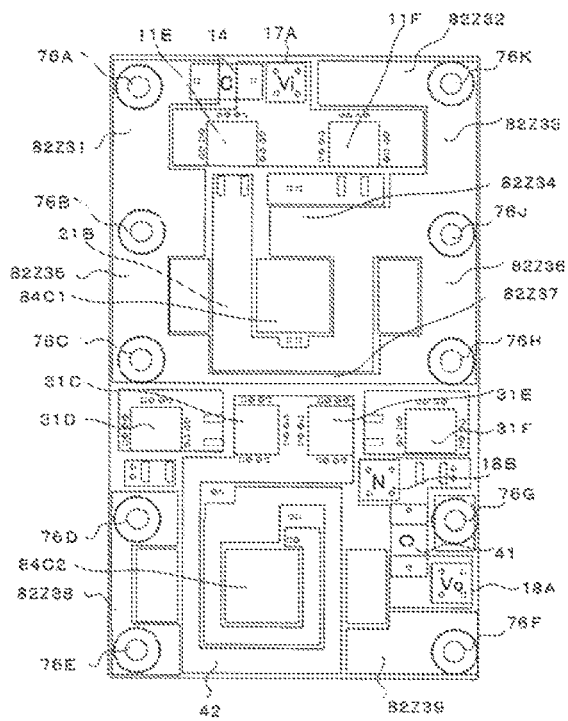
FIGS. 8A to 8D are perspective top views of copper foil patterns on respective layers of a multi-layer printed circuit board of the power conversion device according to the second embodiment of the present invention.
Figure 8B:
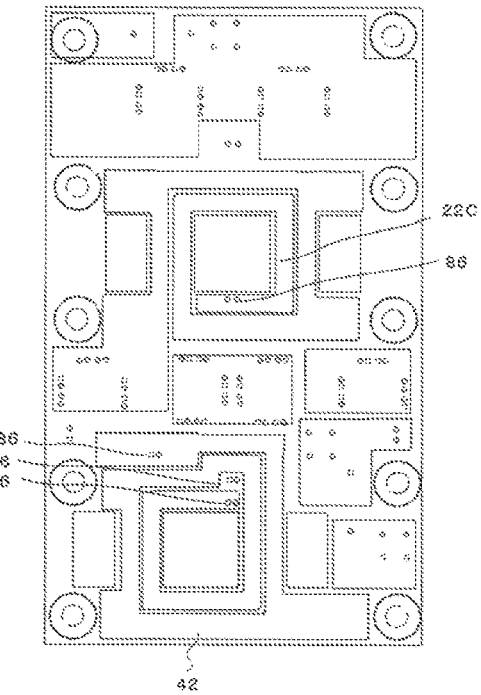
Figure 8C:
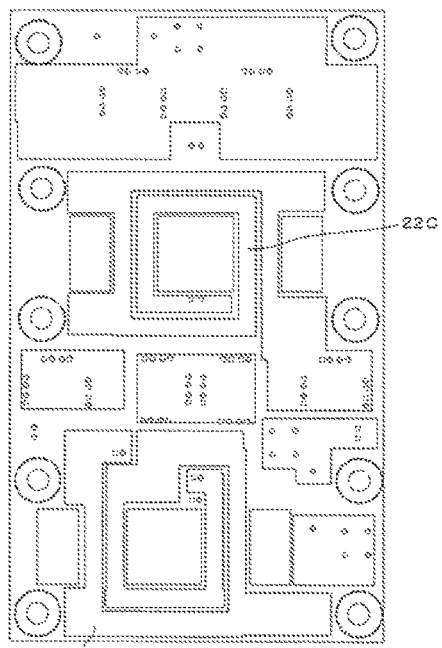
Figure 8D:
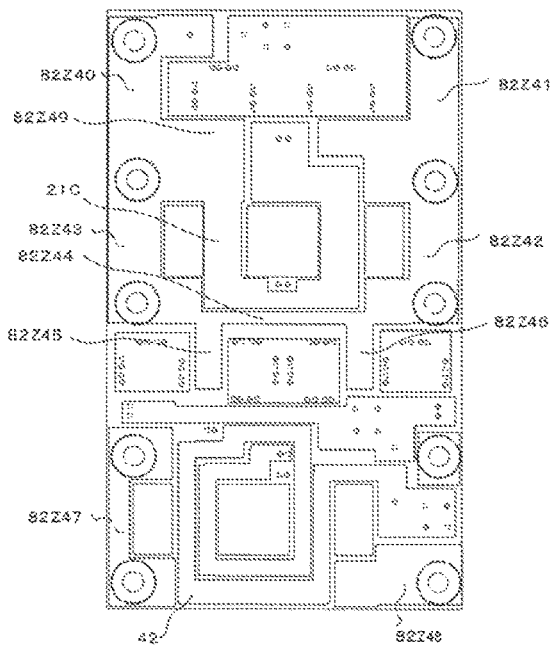

FIGS. 8A to 8D are perspective top views of copper foil patterns on respective layers of the multi-layer printed circuit board of the power conversion device according to the second embodiment of the present invention. As in the first embodiment, the multi-layer printed circuit board 8 has four copper foil layers: a first outer layer, which is illustrated in FIG. 8A and on which surface mounting semiconductor elements and other components are formed, a second outer layer, which is illustrated in FIG. 8D and which is in contact with the cooler 75 directly or via the insulating sheet 78, and a first inner layer and a second inner layer, which are illustrated in FIG. 8B and FIG. 8C, respectively, and which are sandwiched between the outer layers. The layers are electrically connected by copper plating formed on inner walls of through-holes 86 and holes in the screw fixing portion 76A to 76K. The detailed configuration thereof is the same as the one described above with reference to FIG. 13. When the diameter of the screw fixing portions 76 is too large to plate the inner wall by copper plating, the through-holes 86 are placed in the surroundings of the screw fixing portions 76. The four copper foil layers are insulated by glass epoxy resin or other types of resin.

As illustrated in FIG. 13, the ten screw fixing portions 76A to 76K (the screw fixing portion 76I does not exist and is skipped) arranged along the perimeter of the printed circuit board 8 and fixed to the cooler 75 with screws are in contact with the cooler 75 on the second outer layer of FIG. 8D without running through the insulating sheet 78, and thus the screw fixing portions 76A to 76K has the same electric potential as the reference electric potential 72 on the input side of the power conversion device. An input of the power conversion device is connected to an input portion (Vi) 17A, which is illustrated in an upper portion of FIG. 8A, and the cooler 75, which has the reference electric potential, and the output of the power conversion device is connected to an output portion (Vo) 18A and an output portion (N) 18B, which are illustrated in a lower right portion of FIG. 8A.

A through-hole 84C1 in the printed circuit board 8 is denoted by a reference symbol 84C1 in FIG. 8A, and the transformer 2 is constructed from the patterned coil 81 placed around the through-hole 84C1 as illustrated in FIG. 3. In the transformer 2, the secondary-side winding wire 21B is placed on the first outer layer of FIG. 8A, the primary-side winding wire 21C is placed on the second outer layer of FIG. 8D, and the secondary-side winding wire 22C is placed on the first inner layer of FIG. 8B and the second inner layer of FIG. 8C. The primary-side winding wires 21B and 21C are each wound in one turn, and are connected at one end to the screw fixing portions 76B and 76J. The secondary-side winding wire 22C is wound in two turns on each of the first inner layer and the second inner layer, and is connected by the through-holes 86 denoted by the reference symbol 86 of FIG. 8B, and thus the number of turns of the secondary-side winding wire 22C is four turns in total.

Another through-hole 84C2 in the printed circuit board 8 is denoted by a reference symbol 84C2 in a lower portion of FIG. 8A, and the smoothing choke coil 42 is constructed from the patterned coil 81 placed around the through-hole 84C2 as illustrated in FIG. 3. The smoothing choke coil 42 is wound in two turns on each of the layers illustrated in FIG. 8A to FIG. 8D, and are connected by three through-holes 86 denoted by the reference symbol 86 of FIG. 8B, and thus the number of turns of the smoothing choke coil 42 is eight turns in total.

As illustrated in an upper portion of FIG. 8A, the switching elements 11E and 11F are arranged between the input portion (Vi) 17A and the transformer 2 in the order of 11E and 11F from the left side of the drawing sheet.

As illustrated in a middle portion of FIG. 8A, the rectifier elements 31C to 31F are arranged between the transformer 2 and the smoothing choke coil 42 in the order of 31D-31C-31E-31F from the left side of the drawing sheet.

Next, a description is given on the positions of the heat radiation patterns 82, which are arranged between components, and which are connected to the screw fixing portions 76A to 76K having the same electric potential as that of the cooler 75.

The first outer layer of FIG. 8A includes:
a heat radiation pattern 82Z32 connected to the upper right screw fixing portion 76K and placed between the screw fixing portion 76K and the input portion 17A;
heat radiation patterns 82Z31 and 82Z35, to which the screw fixing portions 76A, 76B, and 76C on the upper left side are connected;
heat radiation patterns 82Z33 and 82Z36, to which the screw fixing portions 76K, 76J, and 76H on the upper right side are connected;
a heat radiation pattern 82Z38, to which the screw fixing portions 76D and 76E on the lower left side are connected;
a heat radiation pattern 82Z34 connected to the screw fixing portion 76J and placed between the primary-side winding wire 21B and the switching element 11F in a manner that makes a part of the heat radiation pattern 82Z34 unitary with the primary-side winding wire 21B;
a heat radiation pattern 82Z37, to which the screw fixing portions 76C and 76H are connected, and which is placed between the rectifier elements 31C to 31F and the primary-side winding wire 21B; and
a heat radiation pattern 82Z39 connected to the lower right screw fixing portion 76F and placed between the smoothing choke coil 42, the output portion 18A, and the output capacitor (C) 41.

The second outer layer of FIG. 8D includes:
heat radiation patterns 82Z40 and 82Z43, to which the screw fixing portions 76A, 76B, and 76C on the upper left side of FIG. 8A are connected;
heat radiation patterns 82Z41 and 82Z42, to which the screw fixing portions 76K, 76J, and 76H on the upper right side of FIG. 8A are connected;
a heat radiation pattern 82Z47, to which the screw fixing portions 76D and 76E on the lower left side of FIG. 8A are connected;
a heat radiation pattern 82Z49 connected to the screw fixing portion 76C at the center of the left side of FIG. 8A, and placed between the primary-side winding wire 21C and the switching element 11E in a manner that makes a part of the heat radiation pattern 82Z49 unitary with the primary-side winding wire 21C;
a heat radiation pattern 82Z44, to which the screw fixing portions 76C and 76H at the center of FIG. 8A are connected, and which is placed between the rectifier elements 31C to 31F and the primary-side winding wire 21C, and a heat radiation pattern 82Z45 connected to the screw fixing portion 76C at the center of the left side of FIG. 8A, and placed between the rectifier elements 31C and 31D;
a heat radiation pattern 82Z46 connected to the screw fixing portion 76H at the center of the right side of FIG. 8A, and placed between the rectifier elements 31E and 31F; and
a heat radiation pattern 82Z48 connected to the screw fixing portion 76F in the lower right portion of FIG. 8A, and placed between the smoothing choke coil 42, the output portion 18A, and the output capacitor 41.

Main heat radiation paths of the switching elements 11E and 11F, the rectifier elements 31C to 31F, the transformer 2, and the smoothing choke coil 42, and effects of the heat radiation patterns (82) provided between and around the components, are the same as those in the first embodiment. The second embodiment also has other effects of the first embodiment: the effect of suppressing heat interference among the components and the effect of suppressing heat transmission to the control circuit 5, which is illustrated only in circuit diagrams.

Third Embodiment

While one transformer 2 is provided in the first embodiment and the second embodiment, a third embodiment of the present invention uses two transformers 2A and 2B, in order to deal with high voltage and large current. The transformers in the third embodiment are connected in series on the primary side and connected in parallel on the secondary side to disperse the primary-side voltage and the secondary-side current.

Figure 9:
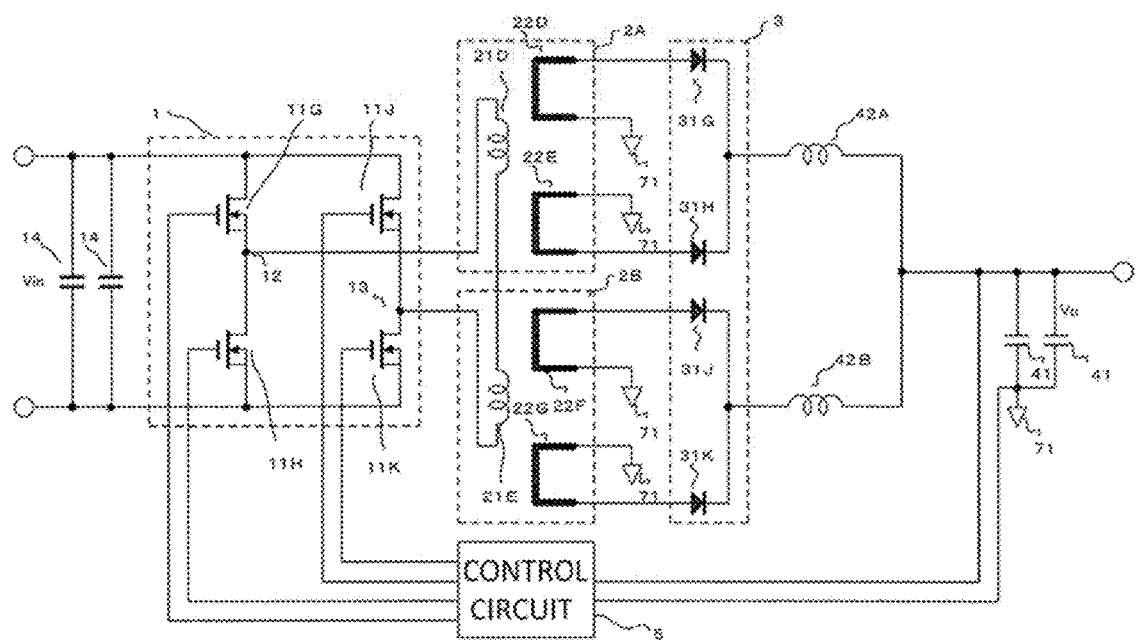
FIG. 9 is a circuit diagram of an example of a power conversion device according to a third embodiment of the present invention.

FIG. 9 is a circuit diagram of an example of a power conversion device according to the third embodiment of the present invention. A primary-side drive circuit 1 includes switching elements 11G and 11H connected in series, and switching elements 11J and 11K connected in series. The switching elements are, for example, N-ch MOSFETs. The positive side of the input capacitor 14, to which an input voltage Vin is supplied, is connected to drain terminals of the switching elements 11G and 11J. Two input capacitors 14 are connected in parallel because the power is larger than in the first embodiment. Source terminals of the switching elements 11H and 11K are connected to the negative side of the input capacitors 14. A primary-side winding wire 21D of the transformer 2A and a primary-side winding wire 21E of the transformer 2B are connected in series between the connection point 12, which connects the switching elements 11G and 11H, and the connection point 13, which connects the switching elements 11J and 11K. The rectifier circuit 3 includes rectifier elements 31G, 31H, 31J, and 31K. The rectifier elements 31G and 31H are connected, on the anode side, to one end of a secondary-side winding wire 22D and one end of a secondary-side winding wire 22E in the transformer 2A, and are both connected, on the cathode side, to one end of a smoothing choke coil 42A. The rectifier elements 31J and 31K are connected, on the anode side, to one end of a secondary-side winding wire 22F and one end of a secondary-side winding wire 22G in the transformer 2B, and are both connected, on the cathode side, to one end of a smoothing choke coil 42B. The other end of the smoothing choke coil 42A and the other end of the smoothing choke coil 42B are connected to one end of one output capacitor 41 and one end of another output capacitor. The output capacitors 41 are outputs of the power conversion device. The other end of the one output capacitor 41, the other end of the other output capacitor 41, the other end of the secondary-side winding wire 22D and the other end of the secondary-side winding wire 22E in the transformer 2A, and the other end of the secondary-side winding wire 22F and the other end of the secondary-side winding wire 22G in the transformer 2B are each connected to the reference electric potential 71 on the output side of the power conversion device. Two output capacitors 41 are connected in parallel because the power is larger than in the first embodiment.

In the third embodiment, the primary-side wiring wires 21D and 22E of the transformers 2A and 2B are each wound in four turns, and the secondary-side winding wires 22D, 22E, 22F, and 22G of the transformer 2 are each wound in one turn. A positive voltage and a negative voltage that are each ⅛ of the input voltage Vin are accordingly generated in the secondary-side winding wires 22D, 22E, 22F, and 22G in a period in which the switching elements 11G and 11K are switched on and a period in which the switching elements 11H and 11J are turned on. The positive voltage and the negative voltage are rectified by the rectifier elements 31G, 31H, 31J, and 31K, and the smoothing choke coils 42A and 42B and the output capacitor 41 turn the rectified voltages into a direct-current voltage through smoothing. An output voltage Vo of the power conversion device is determined by the ratio of the number of turns of the primary-side winding wire and the number of turns of the secondary-side winding wires in the transformers 2A and 2B, and the on/off periods of the switching elements 11G to 11K.

The control circuit 5 feeds the output voltage Vo between the ends of the output capacitor 41 back to input the output voltage Vo, and is connected to gate terminals of the switching elements 11G to 11K. The control circuit 5 controls the on/off periods of the switching elements 11G to 11K so that the output voltage Vo reaches a set value determined in advance. In the third embodiment, in which two transformers 2A and 2B are connected in series on the primary side and connected in parallel on the secondary side, the number of turns per transformer can be reduced when the same amount of step down, that is, to ⅛ of the input voltage, is to be performed, and the wiring width of the patterned coil 81 illustrated in FIG. 3 can accordingly be widened. In addition, the parallel connection of the transformers 2A and 2B on the secondary side and the parallel connection of the smoothing choke coils 42A and 42B allow the secondary-side current to be dispersed, which enables the power conversion device to deal with high voltage and large current.

Figure 10A:
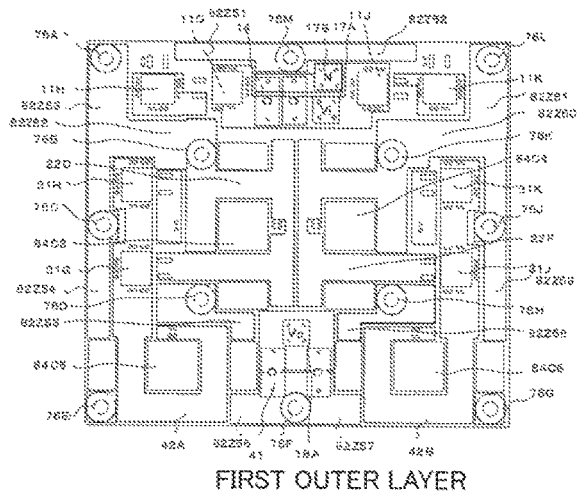
FIGS. 10A to 10D are perspective top views of copper foil patterns on respective layers of a multi-layer printed circuit board of the power conversion device according to the third embodiment of the present invention.
Figure 10B:
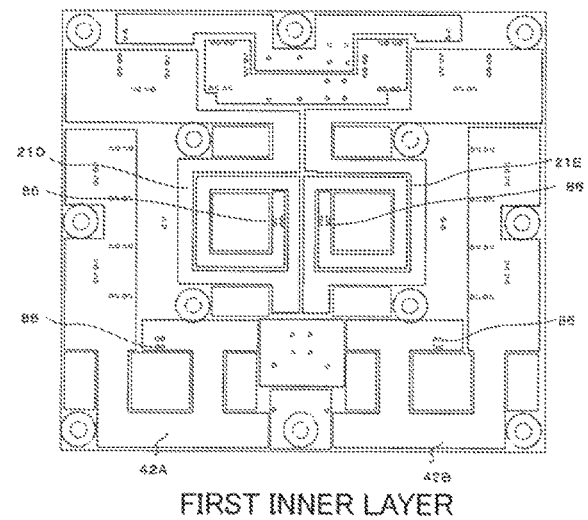
Figure 10C:
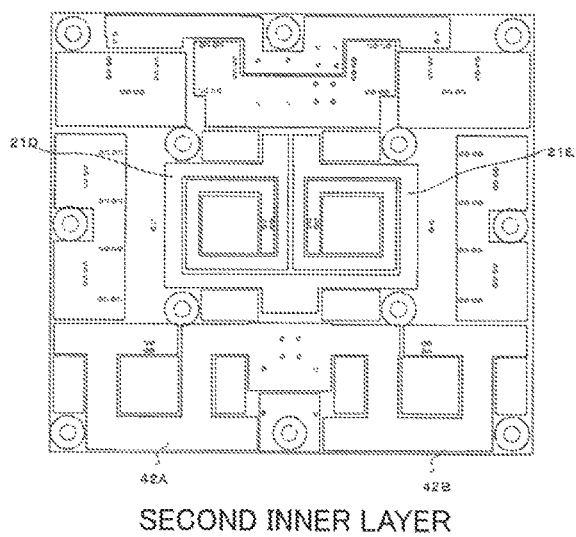
Figure 10D:
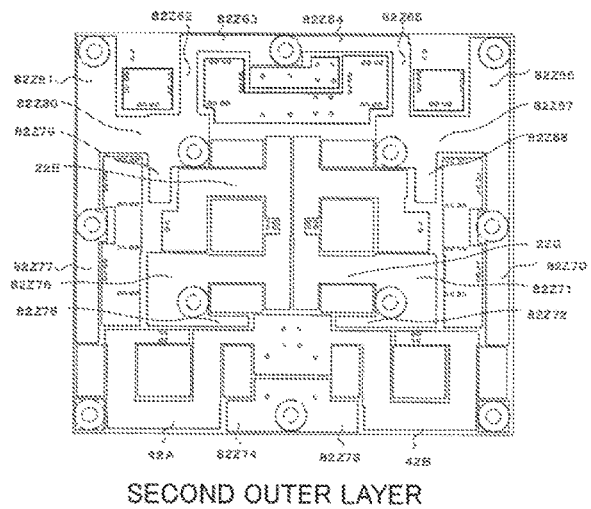

FIGS. 10A to 10D are perspective top views of copper foil patterns on respective layers of the multi-layer printed circuit board of the power conversion device according to the third embodiment of the present invention. As in the first embodiment, the multi-layer printed circuit board 8 has four copper foil layers: a first outer layer, which is illustrated in FIG. 10A and on which surface mounting semiconductor elements and other components are formed, a second outer layer, which is illustrated in FIG. 10D and which is in contact with the cooler 75 directly or via the insulating sheet 78, and a first inner layer and a second inner layer, which are illustrated in FIG. 10B and FIG. 10C, respectively, and which are sandwiched between the outer layers. The layers are electrically connected by copper plating formed on inner walls of through-holes 86 and holes in the screw fixing portion 76A to 76M (the screw fixing portion 76I does not exist and is skipped). The detailed configuration thereof is the same as the one described above with reference to FIG. 13. When the diameter of the screw fixing portions 76 is too large to plate the inner wall by copper plating, the through-holes 86 are placed in the surroundings of the screw fixing portions 76. The four copper foil layers are insulated by glass epoxy resin or other types of resin.

As illustrated in FIG. 13, the twelve screw fixing portions 76A to 76M arranged along the perimeter and at the center of the printed circuit board 8 and fixed to the cooler 75 with screws are in contact with the cooler 75 on the second outer layer of FIG. 10D without running through the insulating sheet 78, and thus the screw fixing portions 76A to 76M has the same electric potential as the reference electric potential 71 on the output side of the power conversion device. An input of the power conversion device is connected to an input portion (Vi) 17A and an input portion (N) 17B, which are illustrated in an upper portion of FIG. 10A, and the output of the power conversion device is connected to an output portion (Vo) 18A, which is illustrated in the center of a lower portion of FIG. 10A, and the cooler 75, which has the reference electric potential.

A through-hole 84C3 in the printed circuit board 8 is denoted by a reference symbol 84C3 in FIG. 10A, and the transformer 2A is constructed from the patterned coil 81 placed around the through-hole 84C1 as illustrated in FIG. 3. In the transformer 2A, the secondary-side winding wire 22D is placed on the first outer layer of FIG. 10A, the secondary-side winding wire 22E is placed on the second outer layer of FIG. 10D, and the primary-side winding wire 21D is placed on the first inner layer of FIG. 10B and the second inner layer of FIG. 10C. A through-hole 84C4 in the printed circuit board 8 is denoted by a reference symbol 84C4 in FIG. 10A, and the transformer 2B is constructed from the patterned coil 81 placed around the through-hole 84C4 as illustrated in FIG. 3. In the transformer 2B, the secondary-side winding wire 22F is placed on the first outer layer of FIG. 10A, the secondary-side winding wire 22G is placed on the second outer layer of FIG. 10D, and the primary-side winding wire 21E is placed on the first inner layer of FIG. 10B and the second inner layer of FIG. 10C. The secondary-side winding wires 22D to 22G are each wound in one turn, and are connected at one end to the screw fixing portions 76B, 76D, 76H, and 76K at the center of the printed circuit board 8 in FIG. 10A. The primary-side winding wires 21D and 21E are each wound in two turns on each of the first inner layer and the second inner layer. The two turns on the first inner layer and the two turns on the second inner layer are connected by the through-holes 86 denoted by the reference symbol 86 of FIG. 10B, and thus the number of turns of each primary-side winding wire is four turns in total. The primary-side winding wire 21D wound in four turns and the primary-side winding wire 21E wound in four turns are connected in series, which brings the total number of turns to eight.

Another through-hole 84C5 in the printed circuit board 8 is denoted by a reference symbol 84C5 in a lower left portion of FIG. 10A, and the smoothing choke coil 42A is constructed from the patterned coil 81 placed around the through-hole 84C5 as illustrated in FIG. 3. The smoothing choke coil 42B is similarly constructed around a through-hole 84C6 denoted by a reference symbol 84C6 in a lower right portion of FIG. 10A. The smoothing choke coils 42A and 42B are each wound in one turn on each layer. A parallel connection between one turn on the first outer layer of FIG.

10A and one turn on the first inner layer of FIG. 10B and a parallel connection between one turn on the second inner layer of FIG. 10C and one turn on the second outer layer of FIG. 10D are connected by the through-holes 86 of FIG. 10B, and thus the number of turns of each smoothing choke coil 42 is two turns in total.

As illustrated in an upper portion of FIG. 10A, the switching elements 11G to 11K are arranged between the input portions 17A and 17B and the transformers 2A and 2B in the order of 11H-11G-11J-11K from the left side of the drawing sheet.

As illustrated in a middle portion of FIG. 10A, the rectifier elements 31G to 31K are arranged so that the rectifier elements 31H and 31G are placed to the left of the transformer 2A in the stated order from the upper end of the drawing sheet, and so that the rectifier elements 31K and 31J are placed to the right of the transformer 2B in the stated order from the upper end of the sheet of paper.

Next, a description is given on the positions of the heat radiation patterns 82, which are arranged between components, and which are connected to the screw fixing portions 76A to 76M having the same electric potential as that of the cooler 75.

The first outer layer of FIG. 10A includes:
- a heat radiation pattern 82Z51 connected to a screw fixing portion 76M at the center of an upper portion and placed on the upper left side, on which the screw fixing portion 76A is located, and a heat radiation pattern 82Z52 connected to the screw fixing portion 76M and placed on the upper right side, on which a screw fixing portion 76L is located;
- a heat radiation pattern 82Z53, to which the screw fixing portions 76A and 76C on the upper left side are connected, and a heat radiation pattern 82Z82, to which the screw fixing portions 76A and 76C and the screw fixing portion 76B are connected;
- a heat radiation pattern 82Z54 connected to the screw fixing portion 76C at the center of the left side, and placed on the lower left side, on which the screw fixing portion 76E is located;
- a heat radiation pattern 82Z61, to which the screw fixing portion 76L and a screw fixing portion 76J on the upper right side are connected, and a heat radiation pattern 82Z60, to which the screw fixing portions 76L and 76J and the screw fixing portion 76K are connected;
- a heat radiation pattern 82Z59 connected to the screw fixing portion 76J at the center of the right side, and placed on the lower right side, on which the screw fixing portion 76G is located;
- a heat radiation pattern 82Z55 connected to the lower left screw fixing portion 76D, and placed between the smoothing choke coil 42A, an output portion 18A, and the output capacitors 41;
- a heat radiation pattern 82Z58 connected to the lower right screw fixing portion 76H, and placed between the smoothing choke coil 42B, the output portion 18A, and the output capacitors 41; and
- a heat radiation pattern 82Z56 connected to the screw fixing portion 76F at the center of a lower portion and placed between the smoothing choke coil 42A and the output capacitors 41, and a heat radiation pattern 82Z57 connected to the screw fixing portion 76F and placed between the smoothing choke coil 42B and the output capacitors 41.

The second outer layer of FIG. 10D includes:
- a heat radiation pattern 82Z63 connected to the screw fixing portion 76M at the center of the upper portion of FIG. 10A and placed on the left side, on which the screw fixing portion 76A is located, and a heat radiation pattern 82Z64 connected to the screw fixing portion 76M and placed on the right side, on which the screw fixing portion 76L is located;
- a heat radiation pattern 82Z62 connected to the screw fixing portion 76B on the left side of FIG. 10A, and placed between the switching elements 11G and 11H;
- a heat radiation pattern 82Z65 connected to the screw fixing portion 76K on the right side of FIG. 10A, and placed between the switching elements 11J and 11K;
- a heat radiation pattern 82Z81 to which the screw fixing portions 76A and 76C on the left side of FIG. 10A are connected, and a heat radiation pattern 82Z80 to which the screw fixing portions 76A and 76C and the screw fixing portion 76B are connected;
- a heat radiation pattern 82Z77 connected to the screw fixing portion 76C at the center of the left side of FIG. 10A, and placed on the lower left side, on which the screw fixing portion 76E is located;
- a heat radiation pattern 82Z66 to which the screw fixing portions 76L and 76J on the right side of FIG. 10A are connected, and a heat radiation pattern 82Z67 to which the screw fixing portions 76L and 76J and the screw fixing portion 76K are connected;
- a heat radiation pattern 82Z70 connected to the screw fixing portion 76J at the center of the right portion of FIG. 10A, and placed on the lower right side, on which the screw fixing portion 76G is located;
- a heat radiation pattern 82Z79 connected to the screw fixing portion 76B on the left side of FIG. 10A, and placed between the secondary-side winding wire 22E and the rectifier element 31H;
- a heat radiation pattern 82Z68 connected to the screw fixing portion 76K on the right side of FIG. 10A, and placed between the secondary-side winding wire 22G and the rectifier element 31K;
- a heat radiation pattern 82Z76 connected to the screw fixing portion 76D on the left side of FIG. 10A, and placed between the secondary-side winding wire 22E and the rectifier element 31G;
- a heat radiation pattern 82Z71 connected to the screw fixing portion 76H on the right side of FIG. 10A, and placed between the secondary-side winding wire 22G and the rectifier element 31J;
- a heat radiation pattern 82Z75 connected to the screw fixing portion 76D on the left side of FIG. 10A, and placed between the smoothing choke coil 42A, the output portion 18A, and the output capacitors 41;
- a heat radiation pattern 82Z72 connected to the screw fixing portion 76H on the right side of FIG. 10A, and placed between the smoothing choke coil 42B, the output portion 18A, and the output capacitors 41; and
- a heat radiation pattern 82Z74 connected to the screw fixing portion 76F at the center of the lower portion of FIG. 10A and placed between the smoothing choke coil 42A and the output capacitors 41, and a heat radiation pattern 82Z73 connected to the screw fixing portion 76F and placed between the smoothing choke coil 42B and the output capacitors 41.

Main heat radiation paths of the switching elements 11G to 11K, the rectifier elements 31G to 31K, the transformers 2A and 2B, and the smoothing choke coils 42A and 42B, and effects of the heat radiation patterns (82) provided between and around the components, are the same as those in the first embodiment. The third embodiment also has other effects of the first embodiment: the effect of suppressing heat interference among the components and the effect of suppressing heat transmission to the control circuit 5, which is illustrated only in circuit diagrams.

In the third embodiment, the transformers 2A and 2B are placed at the center of the printed circuit board 8, the switching elements 11G to 11K and the rectifier elements 31G to 31K are placed around the transformers 2A and 2B, the screw fixing portions 76A to 76M placed around the transformers 2A and 2B at the center of the printed circuit board 8 double as electric connection of the reference electric potential at one end of the secondary-side winding wires 22D to 22G, and as heat conduction connection from the heat radiation patterns 82, and the screw fixing portions 76 are arranged along the perimeter of the printed circuit board 8 for the dual purpose of fixing the circuit board and connecting heat conduction from the heat radiation patterns 82. Heat interference between components can thus be suppressed without increasing the number of screw fixing points when the number of components is increased in order to deal with high voltage and large current.

Figure 11A:
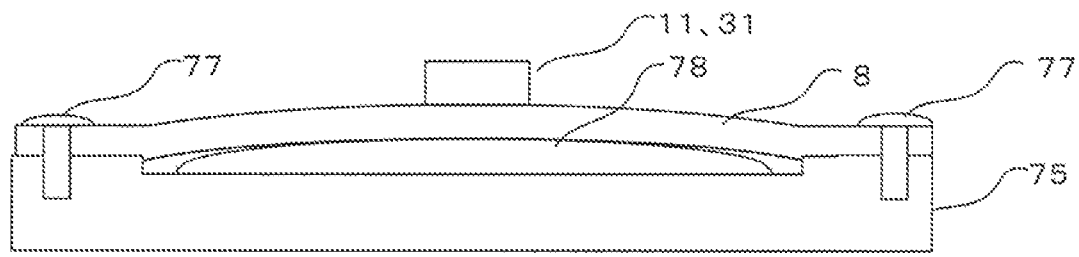
FIGS. 11A and 11B are diagrams for illustrating suppression of the warping of the printed circuit board in the third embodiment of the present invention.
Figure 11B:
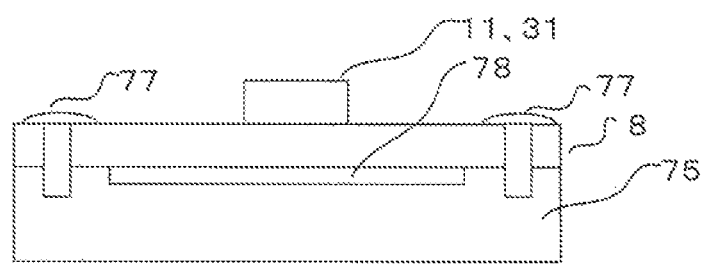
Figure 15:
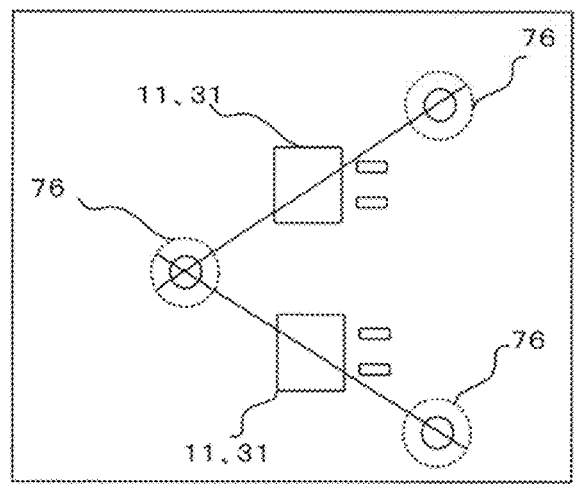
FIG. 15 is a diagram for illustrating a positional relation between the screw fixing portion and a semiconductor element in the third embodiment of the present invention.

As illustrated in FIG. 11A, when the printed circuit board 8 is fixed while squashing the soft insulating sheet 78 interposed between the printed circuit board 8 and the cooler 75, the insulating sheet 78 is not flattened thoroughly if the screw fixing portions 76 are situated far from the switching elements 11 and the rectifier elements 31, with the result that the insulating sheet 78 remains thick in places right below the switching elements 11 and the rectifier elements 31, which may deteriorate heat radiation performance. FIG. 15 is a diagram for illustrating the characteristics of a positional relation of the screw fixing portions 76 to the switching elements 11 or the rectifier elements 31 in the third embodiment. In the third embodiment, each switching element 11 or each rectifier element 31 is placed on a line segment connecting the centers of two screw fixing portions 76 that are placed in the vicinity of the switching element 11 or the rectifier element 31 as illustrated in, for example, FIGS. 10A to 10D and FIG. 15. This ensures that the insulating sheet 78 is flattened evenly as illustrated in FIG. 11B, and prevents the insulating sheet 78 from remaining thick in places. The heat radiation performance for heat generated by the switching elements 11, the rectifier elements 31, and other components is consequently prevented from deteriorating. When the printed circuit board 8 has a thickness of from 1.0 mm to 2.0 mm, the distance between the centers of two screw fixing portions 76, which are placed in the vicinity of one switching element 11 or one rectifier element 31, is, for example, from about 10 mm to about 30 mm. The insulating sheet 78 is flattened more evenly and the heat radiation performance deteriorates less when the switching element 11 or the rectifier element 31 is placed closer to the midpoint of the line segment connecting the centers of the two screw fixing portions 76.

Figure 12:
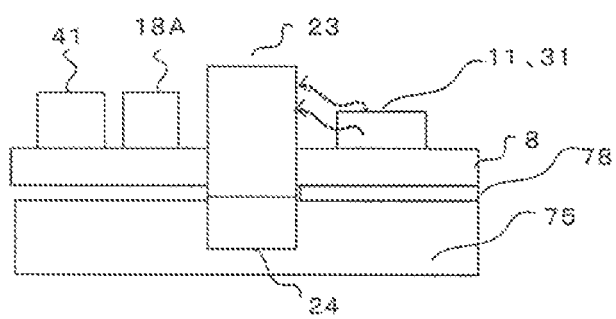
FIG. 12 is a diagram for illustrating switching noise blocking in the third embodiment of the present invention.

As illustrated in FIG. 12, the switching elements 11 and the rectifier elements 31 are switched in the range of from several ten kHz to several hundred kHz, and there is a possibility that high frequency noise is superimposed on the output of the power conversion device. In the third embodiment, however, the core 23 of the transformers 2A and 2B and of the smoothing choke coils 42A and 42B is placed between the switching elements 11, the rectifier elements 31, the output capacitors 41, and the output portion 18A, and is capable of blocking high frequency noise propagated in the air and transmitted to the output capacitors 41 and the output portion 18A.

The present invention is not limited to each of the above-mentioned embodiments, and includes all possible combinations of those embodiments.

As described above, the present invention is not limited to a power conversion device, and is also applicable to various electronic circuit boards having a configuration similar to that of a power conversion device in which a magnetic part including a coil pattern and a magnetic core and a semiconductor element are mounted on a printed circuit board, and the printed circuit board is fixed to a cooler by a screw fixing portion.

The electronic circuit board according to the present invention in the description given above includes: a multi-layer printed circuit board (8), on which magnetic parts (FIG. 3) and semiconductor elements (11 and 31) are mounted, the magnetic parts being formed by a coil pattern (81) formed by magnetic cores (23 and 24) and circuit patterns, the semiconductor elements being connected to the circuit patterns; a cooler (75) placed on an opposite side from a mounting surface of the multi-layer printed circuit board; an insulating member (78), which has heat conductance, and is placed between the multi-layer printed circuit board and the cooler; screw fixing portions (76) placed in surroundings of the coil pattern (81) and the semiconductor elements (11 and 31) to fix the multi-layer printed circuit board (8) and the cooler (75) together; and heat radiation patterns (82) placed between at least two out of the coil pattern (81) and the semiconductor elements (11 and 31) when viewed from a direction perpendicular to a principal surface of the multi-layer printed circuit board (8). The heat radiation patterns (82: FIGS. 5A to 5D and other drawings), the screw fixing portions (76), and the cooler (75) are directly connected in a manner that gives heat conductance and electrical conductance to the heat radiation patterns (82), the screw fixing portions (76), and the cooler (75).

With the configuration described above, heat transmitted in a planar direction between the plurality of semiconductor elements (11 and 31) and the coil pattern (81) is released to the cooler (75) through the heat radiation patterns (82), and heat interference between components of the electronic circuit board or components of a power conversion device can accordingly be suppressed. This allows the components to be placed close to one another and enables the multi-layer printed circuit board to have a small area.

In the electronic circuit board according to the present invention, the heat radiation patterns (82) are placed also in surroundings of at least one of the coil pattern (81) and the semiconductor elements (11 and 31) when viewed from the direction perpendicular to the principal surface of the multi-layer printed circuit board (8).

This configuration has, in addition to the effect of suppressing heat interference between the plurality of semiconductor elements (11 and 31) and the coil pattern (81), an effect in that heat transmitted from the plurality of semiconductor elements (11 and 31) and the coil pattern (81) in a planar direction is prevented from being transmitted to other mounted parts that are components of the power conversion device, for example, an input capacitor (14), an output capacitor (41), and a control circuit (5). Consequently, parts low in heat resistance can be used as the other mounted parts.

In the electronic circuit board according to the present invention, the heat radiation patterns (82) are placed so that the heat radiation patterns (82) overlap with the coil pattern (81), or with the circuit pattern electrically connecting mounted parts to one another, when viewed from the direction perpendicular to the principal surface of the multi-layer printed circuit board (8).

With this configuration, the distance between the plurality of semiconductor elements (11 and 31) and the coil pattern (81) can be made closer even though the heat radiation patterns (82) are placed between and around the plurality of semiconductor elements (11 and 31) and the coil pattern (81), because the coil pattern (81), the heat radiation patterns (82), and the circuit patterns connecting the mounted parts to one another are placed so that the patterns overlap with one another.

In the electronic circuit board according to the present invention, a primary-side winding wire (21) and a secondary-side winding wire (22) of a transformer (2), which is a magnetic part, are constructed from the coil pattern (81) placed so as to overlap when viewed from the direction perpendicular to the principal surface of the multi-layer printed circuit board (8), and one end of one of the primary-side winding wire (21) and the secondary-side winding wire (22) that has a smaller number of turns is connected to the screw fixing portions (76), and is electrically connected to the cooler (75).

With this configuration, one end of the coil pattern (81) is thermally connected to the cooler (75), and the heat radiation performance for heat from the coil pattern (81) is accordingly improved. This configuration also keeps the number of screw fixing portions (76) from increasing because the same screw fixing portions (76) are shared as the screw fixing portions (76) to which the heat radiation patterns (82) are connected and as the screw fixing portions (76) to which the one end of the coil pattern (81) is connected.

In the electronic circuit board according to the present invention, one end of the coil pattern (81) is connected to the screw fixing portions (76).

With this configuration, the screw fixing portions (76) to which the one end of the coil pattern (81) is connected are used also as the screw fixing portions (76) to which the heat radiation patterns (82) are connected, which means that one screw fixing portion (76) can be shared between different uses.

A power conversion device according to the present invention is constructed from the electronic circuit board described above, includes, as magnetic parts, a step-up transformer (2: FIG. 7) or a step-down transformer (2: FIG. 4) and a smoothing choke coil (42), and includes, as semiconductor elements (11 and 31), switching elements (11) connected to a primary side of the step-up transformer (2: FIG. 7) or the step-down transformer (2: FIG. 4) and rectifier elements (31) connected to a secondary side of the step-up transformer (2: FIG. 7) or the step-down transformer (2: FIG. 4). The switching elements (11), the step-up transformer (2: FIG. 7) or the step-down transformer (2: FIG. 4), the rectifier elements (31), and the smoothing choke coil (42) are placed on the multi-layer printed circuit board (8) in the stated order.

With this configuration, the screw fixing portions (76) and the heat radiation patterns (82) are easily placed and shared, and can accordingly be reduced in number.

Figure 16:
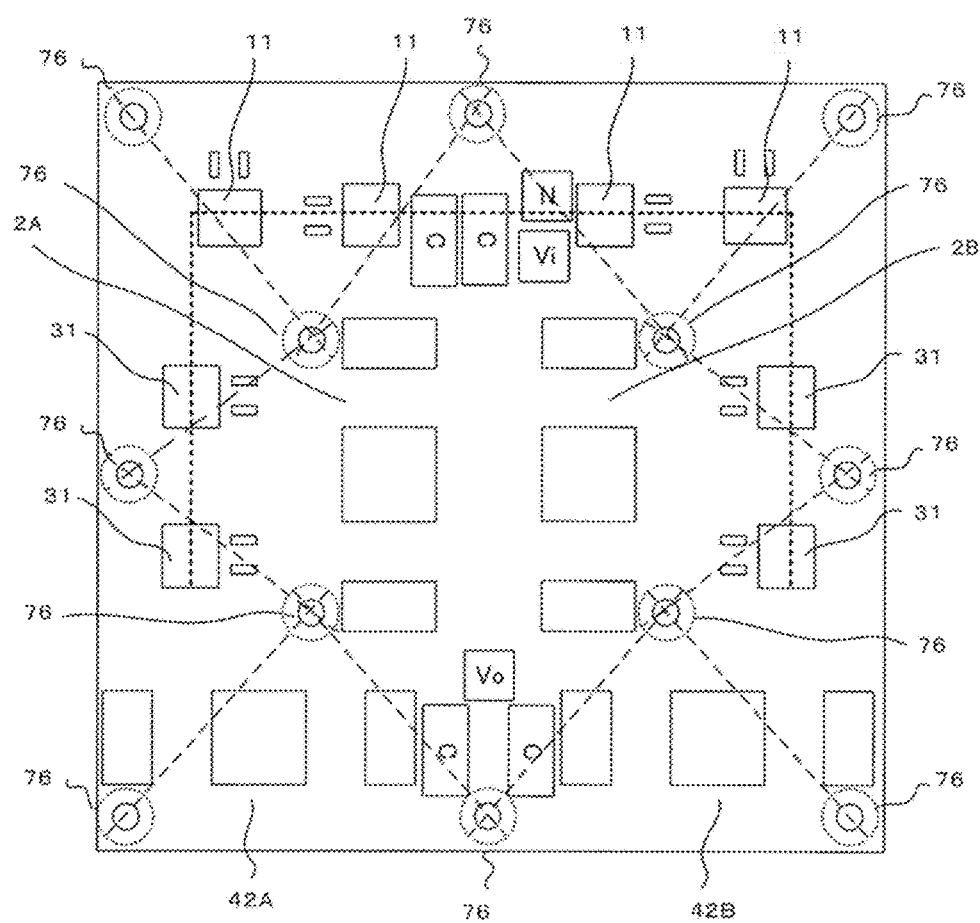
FIG. 16 is a diagram for illustrating positional relations of a plurality of semiconductor elements to screw fixing portions around the semiconductor elements in the third embodiment of the present invention.

A power conversion device according to the present invention is constructed from the electronic circuit board described above, includes, as magnetic parts, two step-down transformers (2A and 2B) and two smoothing choke coils (42A and 42B), and includes, as semiconductor elements (11 and 31), a plurality of switching elements (11) connected to a primary side of the two step-down transformers (2A and 2B) and rectifier elements (31) connected to a secondary side of the two step-down transformers (2A and 2B). Primary-side winding wires (21D and 21E) of the two step-down transformers (2A and 2B) are connected in series, and a secondary-side circuit formed by secondary-side winding wires (22), the rectifier elements (31G to 31K), and the smoothing choke coils (42A and 42B) is connected in parallel. As illustrated in FIG. 16, the two step-down transformers (2A and 2B) are placed at the center when viewed from a direction perpendicular to the principal surface of the multi-layer printed circuit board (8), and the plurality of switching elements (11), the rectifier elements (31), and the smoothing choke coils (42) are placed around the two step-down transformers (2A and 2B). The plurality of switching elements (11) and the rectifier elements (31) are arranged in a U shape. The screw fixing portions (76) are arranged into a triangular lattice pattern around the two step-down transformers (2A and 2B) and around the plurality of switching elements (11), the rectifier elements (31), and the smoothing choke coils (42).

With this configuration, two or more screw fixing portions (76) are placed around the semiconductor elements (11 and 31) and around the coil pattern (81) each, and the warping of the circuit board is accordingly suppressed, thereby avoiding the deterioration of heat radiation performance due to the warping of the circuit board. In addition, with the smoothing choke coils (42) placed between the semiconductor elements (11 and 31), which are sources of noise, and another circuit, which receives the noise, the cores (23 and 24) of the smoothing choke coils (42) suppresses noise radiated to the other circuit.

In the electronic circuit board according to the present invention, the semiconductor elements (11 and 31) are each placed on a line segment connecting the centers of two screw fixing portions (76). This suppresses the warping of the printed circuit board in the portions of the semiconductor elements (11 and 31), and enables the electronic circuit board to dissipate heat efficiently even when the semiconductor elements (11 and 31) are of the type that generates a large amount of heat.

Step-down transformers (2A and 2B), the smoothing choke coils (42), the semiconductor elements (11 and 31), and the screw fixing portions (76) are arranged on the printed circuit board (8) as described above with reference to FIG. 16. The same screw fixing portion (76) is shared as the screw fixing portion (76) that is a reference for a line segment with which the placement and position of one semiconductor element are determined, and as the screw fixing portion (76) that is a reference for a line segment with which the placement and position of another semiconductor element is determined. In other words, the plurality of semiconductor elements (11 and 31) are placed so that one screw fixing portions (76) is used as a reference for line segments with which the placement and positions of a plurality of semiconductor elements (11 and 31) are determined. The number of screw fixing portions (76) can be reduced in this manner.

REFERENCE SIGNS LIST 1 primary-side drive circuit; 2, 2A, 2B transformer; 3 rectifier circuit; 5 control circuit; 8 printed circuit board; 11, 11A to 11K switching element; 12, 13 connection point; 14 input capacitor; 17A, 17B input portion; 18A, 118B output portion; 21A to 21E primary-side winding wire; 22A to 22G secondary-side winding wire; 23 E-shaped core; 23A, 23B outer leg portion; 23C middle leg portion; 24 I-shaped core; 31, 31A to 31K rectifier element; 32, 33 connection point; 41 output capacitor; 42, 42A, 42B smoothing choke coil; 71, 72 reference electric potential; 75 cooler; 76, 76A to 76M screw fixing portion; 78 insulating sheet; 81 patterned coil; 82 heat radiation pattern; 84A to 84C through-hole; 86 through-hole; H arrow

The invention claimed is:

1. An electronic circuit board, comprising:
   a multi-layer printed circuit board having mounted thereon a magnetic part and semiconductor elements, the magnetic part being formed by a magnetic core and a coil pattern formed by a circuit pattern that connects mounted parts to one another, and the semiconductor elements being connected to the circuit pattern;
   a cooler placed on an opposite side from a mounting surface of the multi-layer printed circuit board;
   an insulating member, which has heat conductance, and is placed between the multi-layer printed circuit board and the cooler;
   a plurality of screw fixing portions placed in surroundings of the coil pattern and the semiconductor elements to fix the multi-layer printed circuit board and the cooler together; and
   a heat radiation pattern placed between at least two out of the coil pattern and the semiconductor elements when viewed from a direction perpendicular to a principal surface of the multi-layer printed circuit board,
   wherein, when viewed from the direction perpendicular to the principal surface of the multi-layer printed circuit board, the semiconductor elements are each placed on a line segment that connects two screw fixing portions out of the plurality of screw fixing portions,
   wherein the heat radiation pattern, the screw fixing portion, and the cooler are directly connected in a manner that gives heat conductance and electrical conductance to the heat radiation pattern, the screw fixing portion, and the cooler.

2. The electronic circuit board according to claim 1, wherein the plurality of semiconductor elements are arranged so that one screw fixing portion out of the plurality of screw fixing portions serves as a reference for a line segment with which placement and positions of the plurality of semiconductor elements are determined.

3. The electronic circuit board according to claim 1, wherein a primary-side winding wire and a secondary-side winding wire of a transformer, which is the magnetic part, are formed by the coil pattern placed so as to overlap when viewed from the direction perpendicular to the principal surface of the multi-layer printed circuit board, and one end of one of the primary-side winding wire and the secondary-side winding wire that has a smaller number of turns than the other of the primary-side winding wire and the secondary-side winding wire is connected to the screw fixing portion, and is electrically connected to the cooler.

4. The electronic circuit board according to claim 2, wherein a primary-side winding wire and a secondary-side winding wire of a transformer, which is the magnetic part, are formed by the coil pattern placed so as to overlap when viewed from the direction perpendicular to the principal surface of the multi-layer printed circuit board, and one end of one of the primary-side winding wire and the secondary-side winding wire that has a smaller number of turns than the other of the primary-side winding wire and the secondary-side winding wire is connected to the screw fixing portion, and is electrically connected to the cooler.

5. The electronic circuit board according to claim 1, wherein one end of the coil pattern is connected to the screw fixing portion.

6. The electronic circuit board according to claim 2, wherein one end of the coil pattern is connected to the screw fixing portion.

7. The electronic circuit board according to claim 3, wherein one end of the coil pattern is connected to the screw fixing portion.

8. The electronic circuit board according to claim 4, wherein one end of the coil pattern is connected to the screw fixing portion.

9. The electronic circuit board according to claim 1, wherein, when viewed from the direction perpendicular to the principal surface of the multi-layer printed circuit board, the heat radiation pattern is placed also in surroundings of at least one of the coil pattern and the semiconductor elements.

10. The electronic circuit board according to claim 1, wherein, when viewed from the direction perpendicular to the principal surface of the multi-layer printed circuit board, the heat radiation pattern overlaps with the coil pattern, or with the circuit pattern connecting mounted parts to one another.

11. A power conversion device, comprising the electronic circuit board of claim 1,
    wherein the power conversion device comprises, as the magnetic part, a step-up transformer or a step-down transformer and a smoothing choke coil,
    wherein the power conversion device comprises, as the semiconductor elements, a switching element connected to a primary side of the step-up transformer or the step-down transformer, and a rectifier element connected to a secondary side of the step-up transformer or the step-down transformer, and
    wherein the switching element, the step-up transformer or the step-down transformer, the rectifier element, and the smoothing choke coil are placed on the multi-layer printed circuit board in the stated order.

12. A power conversion device, comprising the electronic circuit board of claim 1,
    wherein the power conversion device comprises, as the magnetic part, two step-down transformers and two smoothing choke coils,
    wherein the power conversion device comprises, as the semiconductor elements, a plurality of switching elements connected to a primary side of the two step-down transformers, and rectifier elements connected to a secondary side of the two step-down transformers,
    wherein primary-side winding wires of the two step-down transformers are connected in series, and a secondary-side circuit formed by secondary-side winding wires of the two step-down transformers, the rectifier elements, and the smoothing choke coils is connected in parallel,
    wherein, when viewed from the direction perpendicular to the principal surface of the multi-layer printed circuit board, the two step-down transformers are placed at a central portion of the principal surface, the plurality of switching elements, the rectifier elements, and the smoothing choke coils are placed around the two step-down transformers, and the plurality of switching elements and the rectifier elements are arranged in a U shape, and
    wherein the screw fixing portions are arranged into a triangular lattice pattern around the two step-down transformers and around the plurality of switching elements, the rectifier elements, and the smoothing choke coils.

13. An electronic circuit board, comprising:
    a multi-layer printed circuit board having mounted thereon a magnetic part and semiconductor elements, the magnetic part being formed by a magnetic core and a coil pattern formed by a circuit pattern, and the semiconductor elements being connected to the circuit pattern that connects mounted parts to one another;
a cooler placed on an opposite side from a mounting surface of the multi-layer printed circuit board;
an insulating member, which has heat conductance, and is placed between the multi-layer printed circuit board and the cooler;
a screw fixing portion placed in surroundings of the coil pattern and the semiconductor elements to fix the multi-layer printed circuit board and the cooler together; and
wherein at least two layers of the plurality of layers each include a heat radiation pattern placed between at least two out of the coil pattern and the semiconductor elements when viewed from a direction perpendicular to a principal surface of the multi-layer printed circuit board, and disconnected to the coil pattern and the circuit pattern connected to the semiconductor elements,
wherein the heat radiation patterns of each layer, the screw fixing portion, and the cooler are directly connected in a manner that gives heat conductance and electrical conductance between the heat radiation patterns, the screw fixing portion, and the cooler,
wherein the power conversion device comprises, as the magnetic part, two step-down transformers and two smoothing choke coils,
wherein the power conversion device comprises, as the semiconductor elements, a plurality of switching elements connected to a primary side of the two step-down transformers, and rectifier elements connected to a secondary side of the two step-down transformers,
wherein primary-side winding wires of the two step-down transformers are connected in series, and a secondary-side circuit formed by secondary-side winding wires of the two step-down transformers, the rectifier elements, and the smoothing choke coils is connected in parallel,
wherein, when viewed from the direction perpendicular to the principal surface of the multi-layer printed circuit board, the two step-down transformers are placed at a central portion of the principal surface, the plurality of switching elements, the rectifier elements, and the smoothing choke coils are placed around the two step-down transformers, and the plurality of switching elements and the rectifier elements are arranged in a U shape, and
wherein the screw fixing portions are arranged into a triangular lattice pattern around the two step-down transformers and around the plurality of switching elements, the rectifier elements, and the smoothing choke coils.

14. The electronic circuit board according to claim 13, wherein, when viewed from the direction perpendicular to the principal surface of the multi-layer printed circuit board, the heat radiation pattern is placed also in surroundings of at least one of the coil pattern and the semiconductor elements.

15. The electronic circuit board according to claim 13, wherein, when viewed from the direction perpendicular to the principal surface of the multi-layer printed circuit board, the heat radiation pattern overlaps with the coil pattern, or with the circuit pattern connecting mounted parts to one another.

* * * * *